United States Patent
Ojima et al.

(10) Patent No.: US 12,451,443 B2
(45) Date of Patent: Oct. 21, 2025

(54) SEMICONDUCTOR DEVICE

(71) Applicant: Kioxia Corporation, Tokyo (JP)

(72) Inventors: Mayuka Ojima, Yokohama (JP); Sachiyo Ito, Kawasaki (JP); Takuya Konno, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 565 days.

(21) Appl. No.: 17/883,690

(22) Filed: Aug. 9, 2022

(65) Prior Publication Data

US 2023/0317632 A1    Oct. 5, 2023

(30) Foreign Application Priority Data

Mar. 11, 2022 (JP) .................................. 2022-038300

(51) Int. Cl.
| | | |
|---|---|---|
| *H01L 23/00* | (2006.01) | |
| *H01L 23/58* | (2006.01) | |
| *H10B 41/27* | (2023.01) | |
| *H10B 43/27* | (2023.01) | |

(52) U.S. Cl.
CPC .......... *H01L 23/562* (2013.01); *H01L 23/564* (2013.01); *H01L 23/585* (2013.01); *H10B 41/27* (2023.02); *H10B 43/27* (2023.02)

(58) Field of Classification Search
CPC .................................................... H01L 23/562
See application file for complete search history.

(56) References Cited

U.S. PATENT DOCUMENTS

| | | |
|---|---|---|
| 7,189,588 B2 | 3/2007 | Usui et al. |
| 10,910,272 B1 | 2/2021 | Zhou et al. |
| 2004/0245642 A1 | 12/2004 | Hasunuma et al. |
| 2021/0053148 A1 | 2/2021 | Rieske et al. |
| 2021/0313246 A1* | 10/2021 | Matsumura ............ H10B 43/40 |

FOREIGN PATENT DOCUMENTS

| | | |
|---|---|---|
| JP | 2004-296905 A | 10/2004 |
| JP | 4117156 B2 | 7/2008 |
| JP | 2021-068870 A | 4/2021 |

* cited by examiner

*Primary Examiner* — Ajay Ojha
*Assistant Examiner* — Hajar Kolahdouzan
(74) *Attorney, Agent, or Firm* — Oblon, McClelland, Maier & Neustadt, L.L.P.

(57) ABSTRACT

A semiconductor device according to an embodiment includes a substrate, a transistor, an insulating layer, and a first sealing portion. The substrate includes a first region, and a second region provided to surround an outer periphery of the first region. The transistor is provided on the substrate in the first region. The insulating layer is provided above the transistor and over the first region and the second region. The first sealing portion is provided to divide the insulating layer and surround the outer periphery of the first region in the second region. The first sealing portion includes a first void.

17 Claims, 24 Drawing Sheets

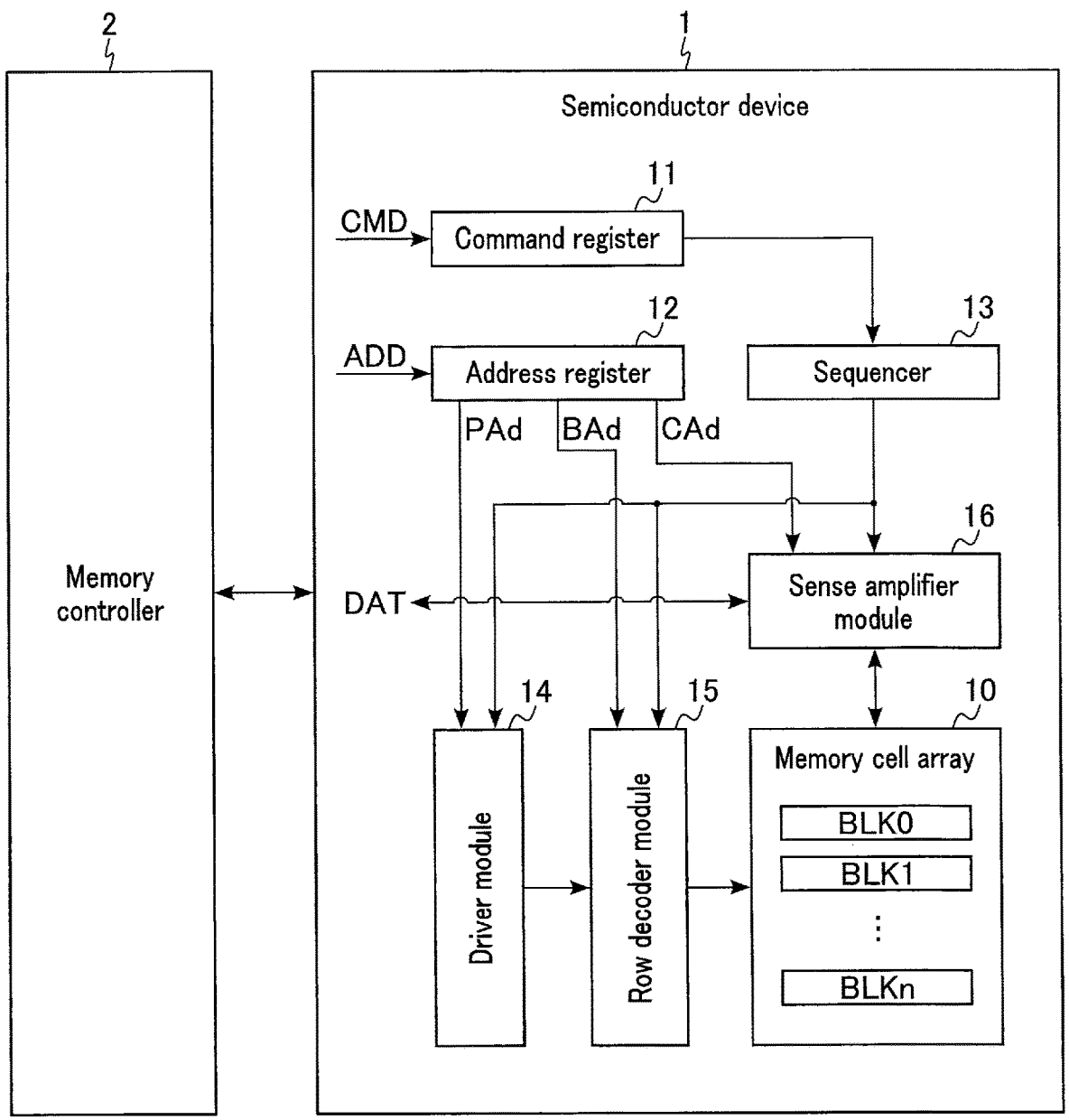
F I G. 1

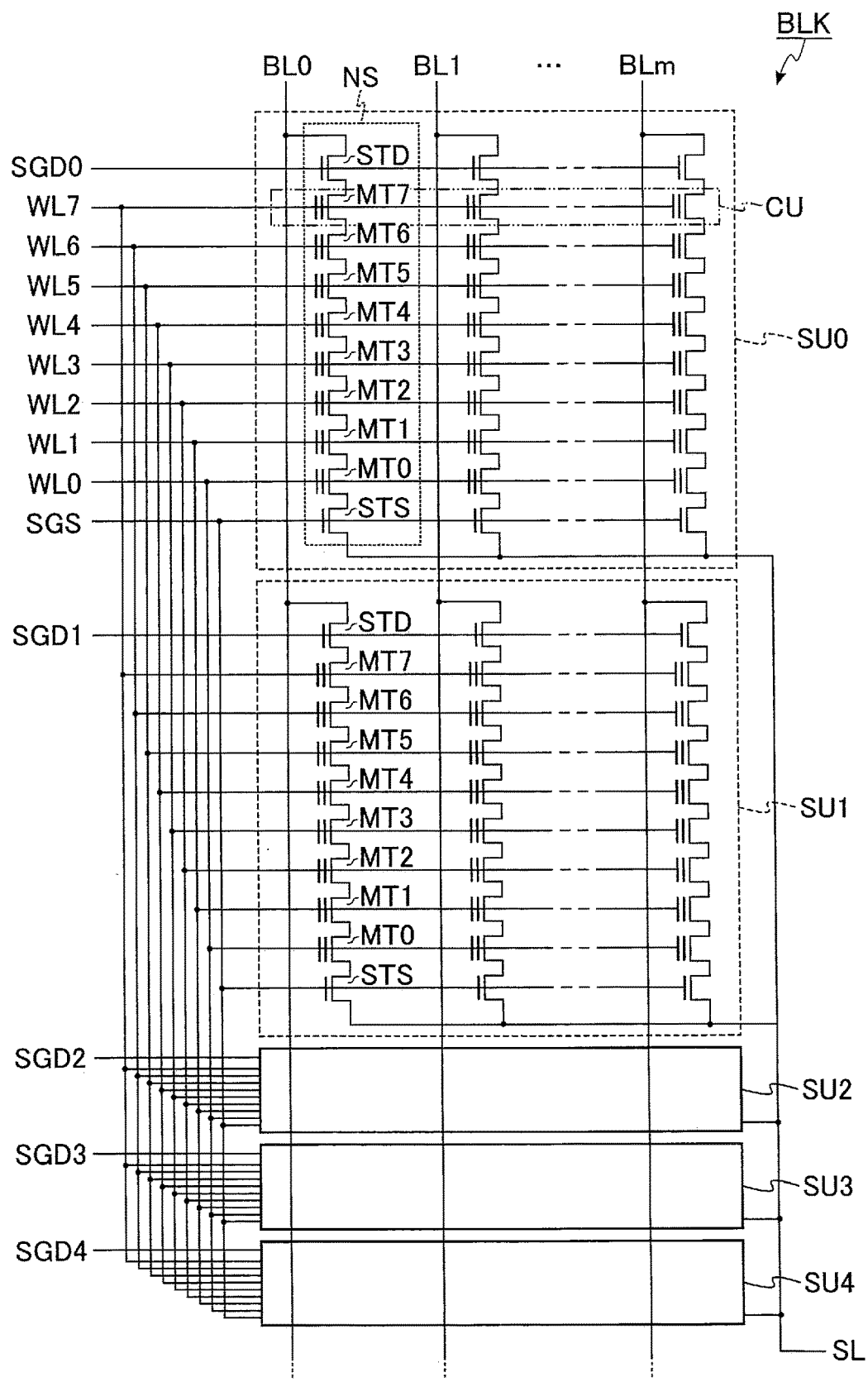
F I G. 2

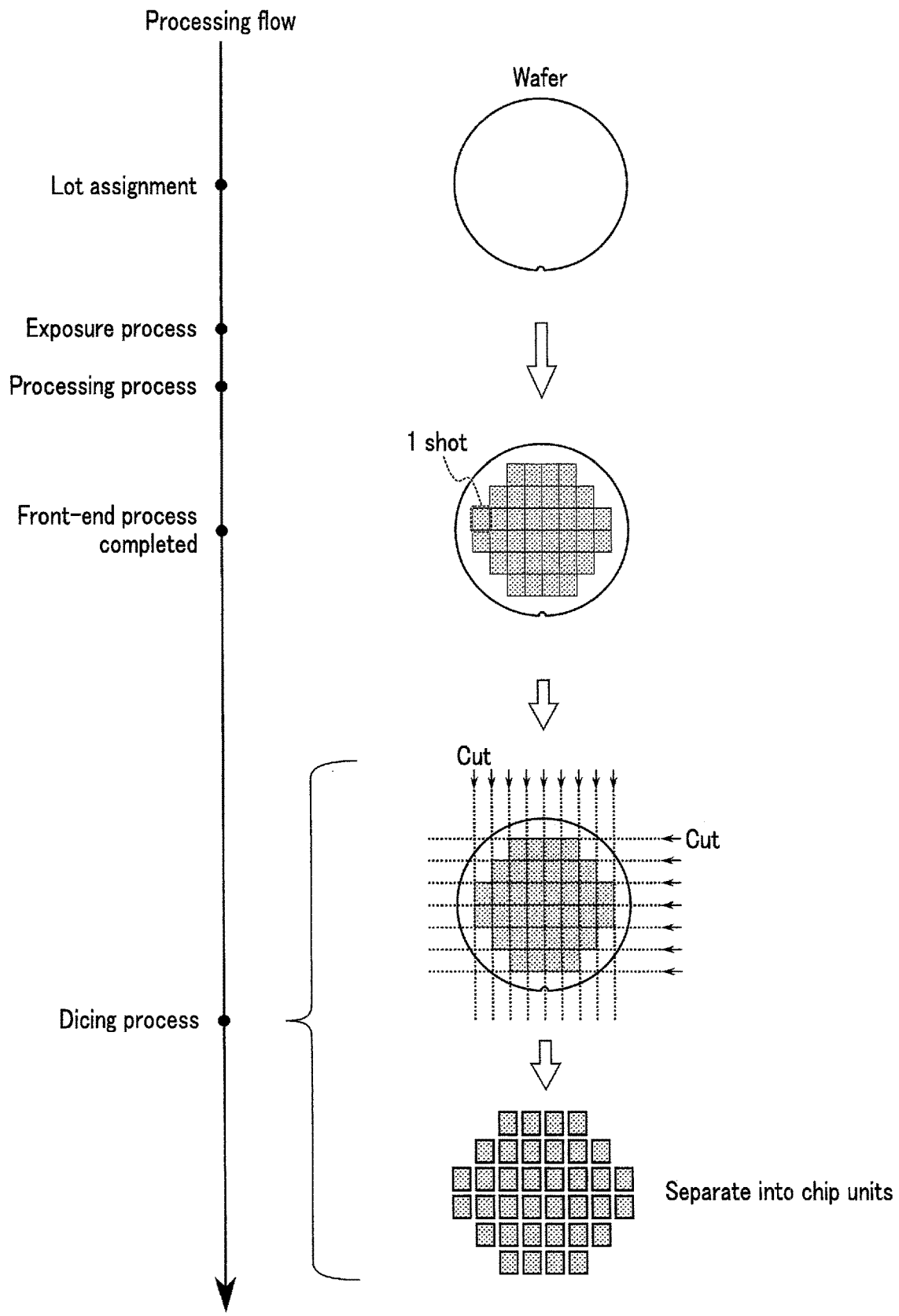
F I G. 12

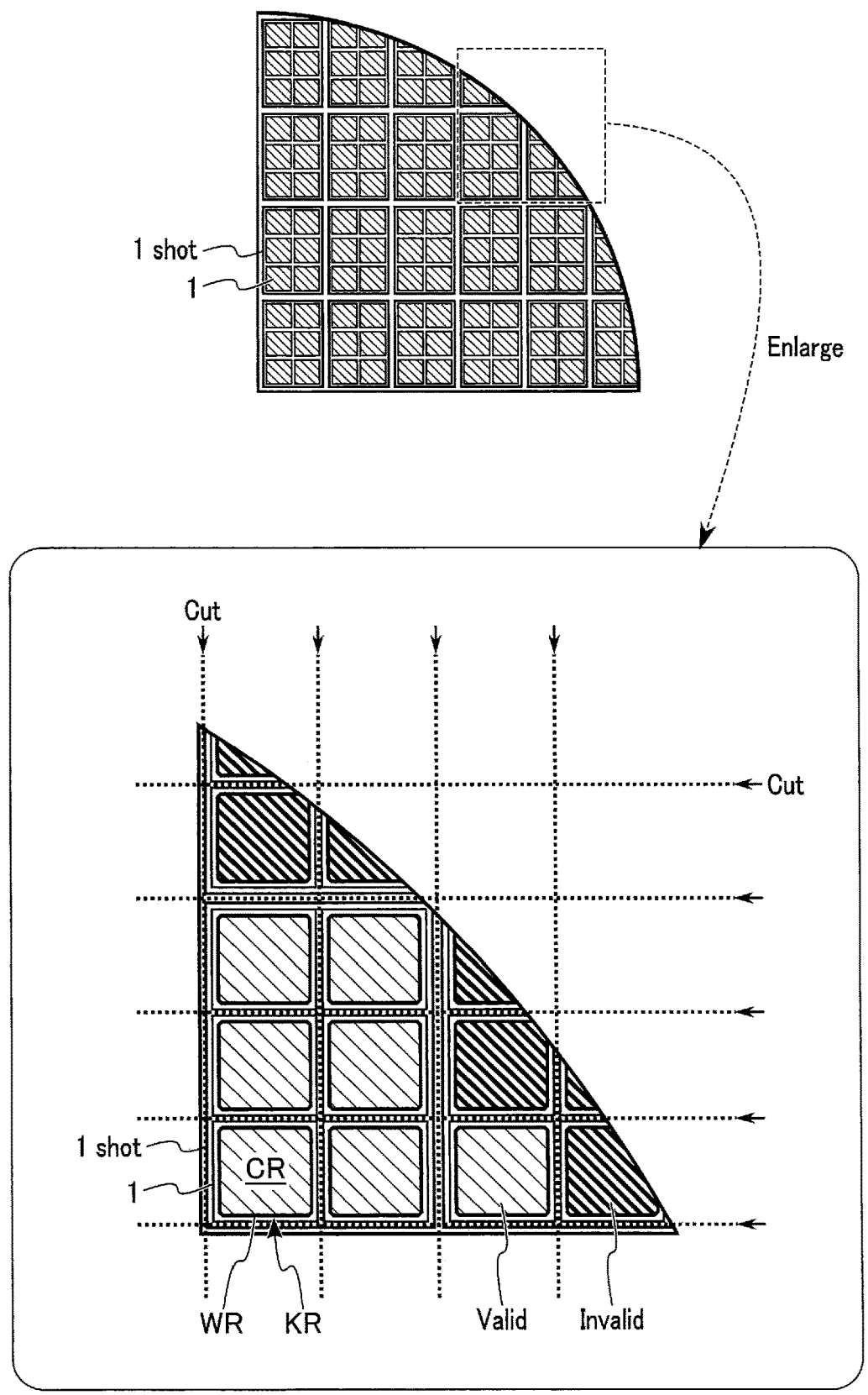
F I G. 13

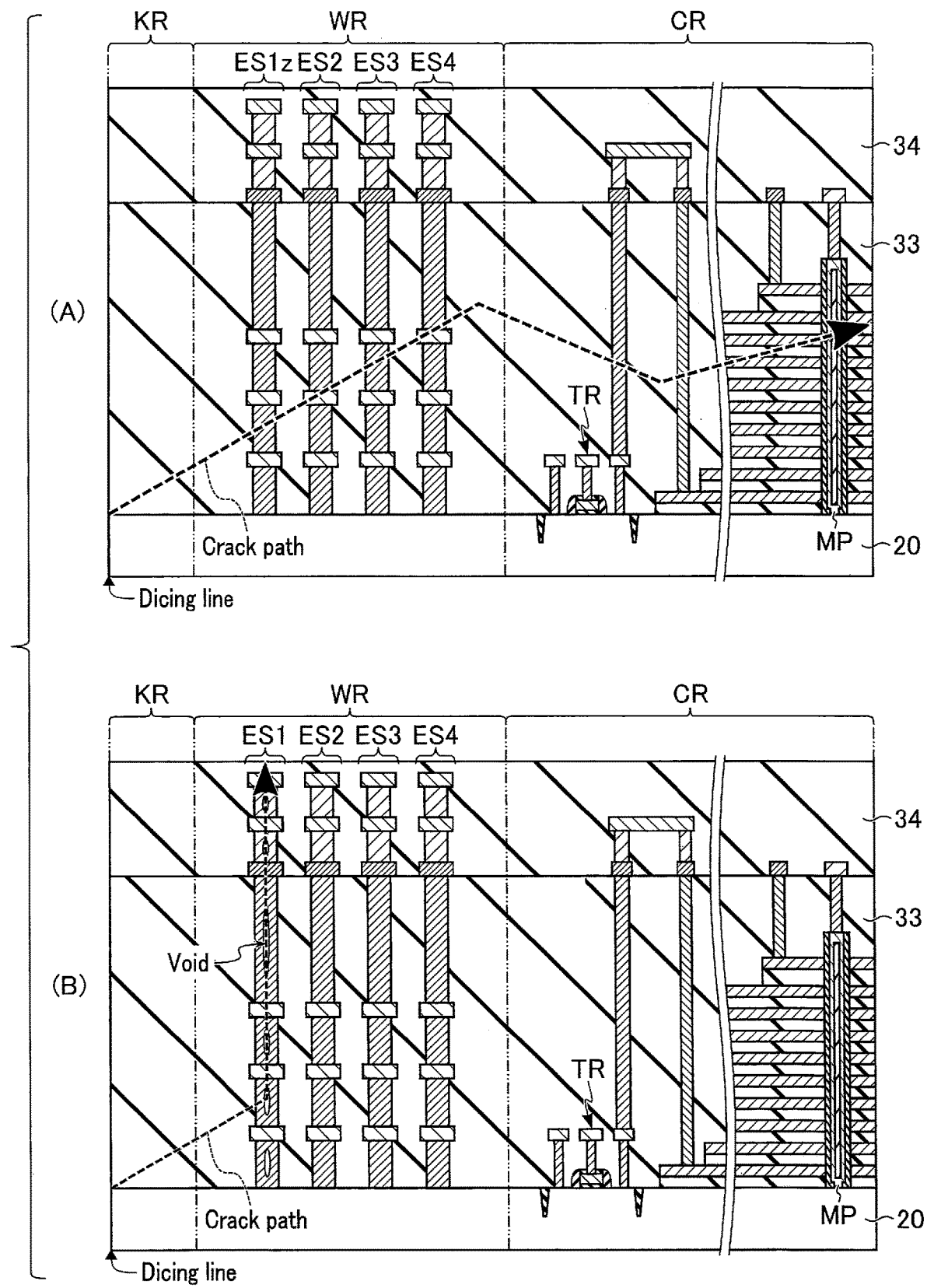
F I G. 16

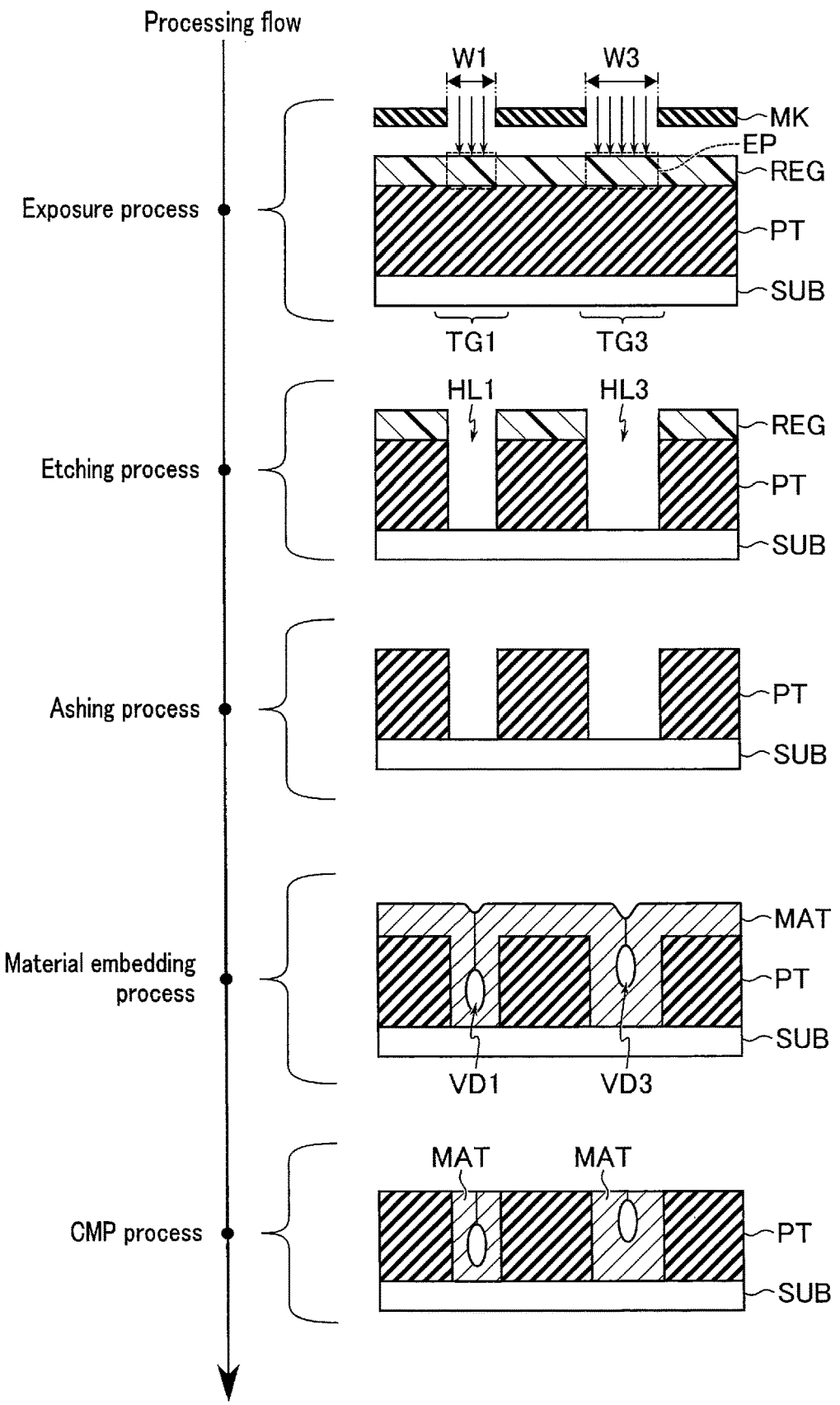
F I G. 23

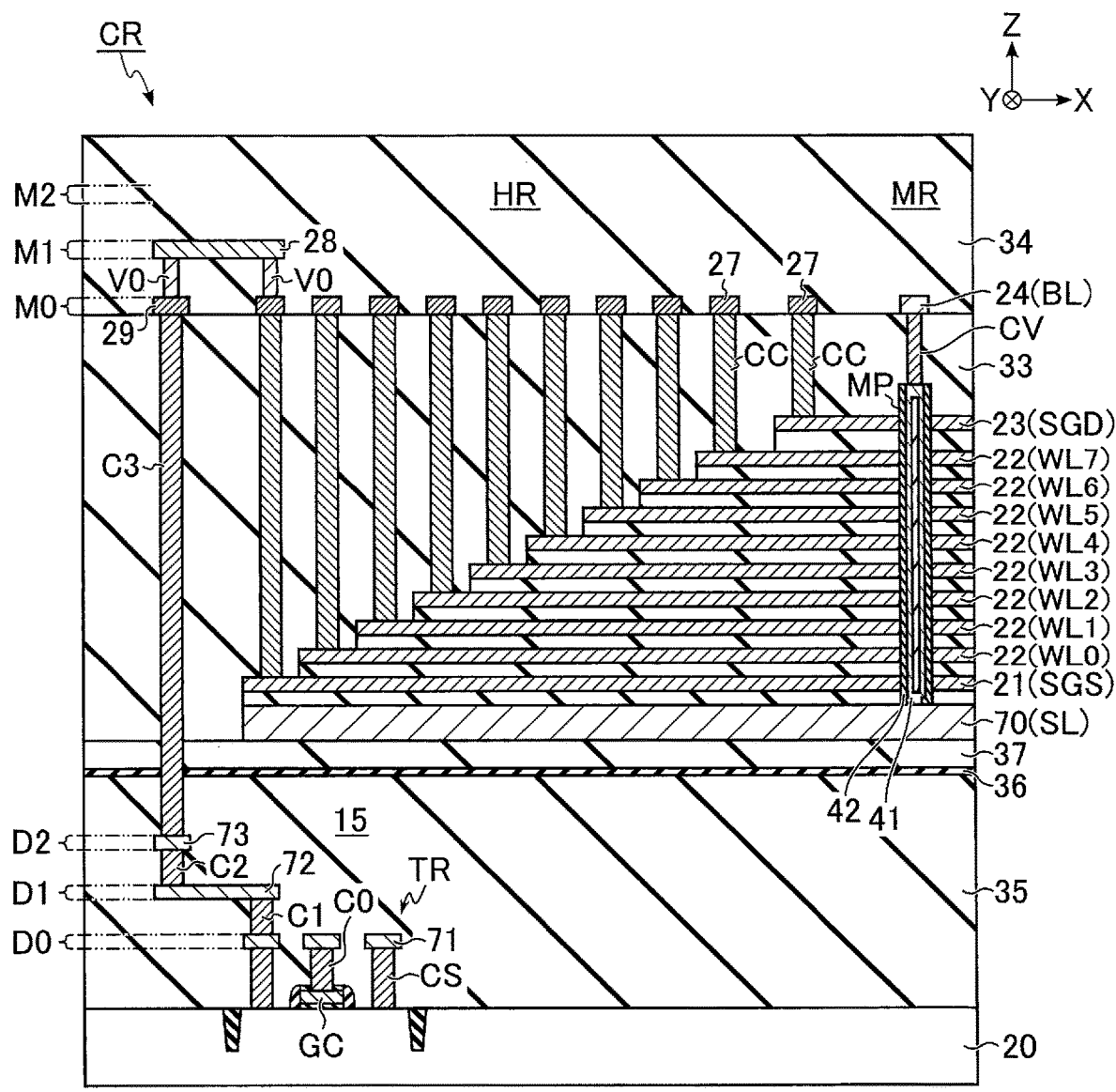
F I G. 24

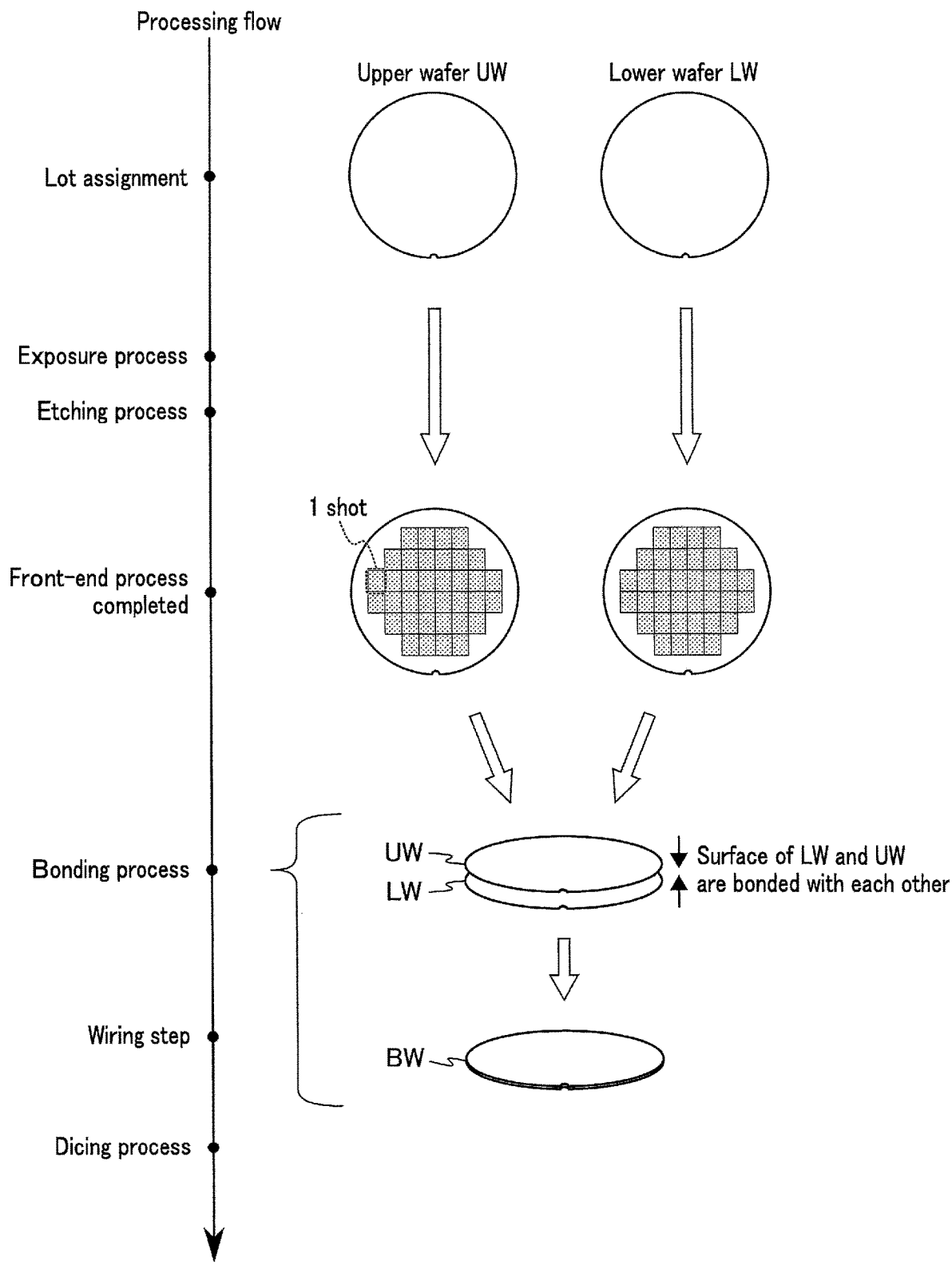
F I G. 26

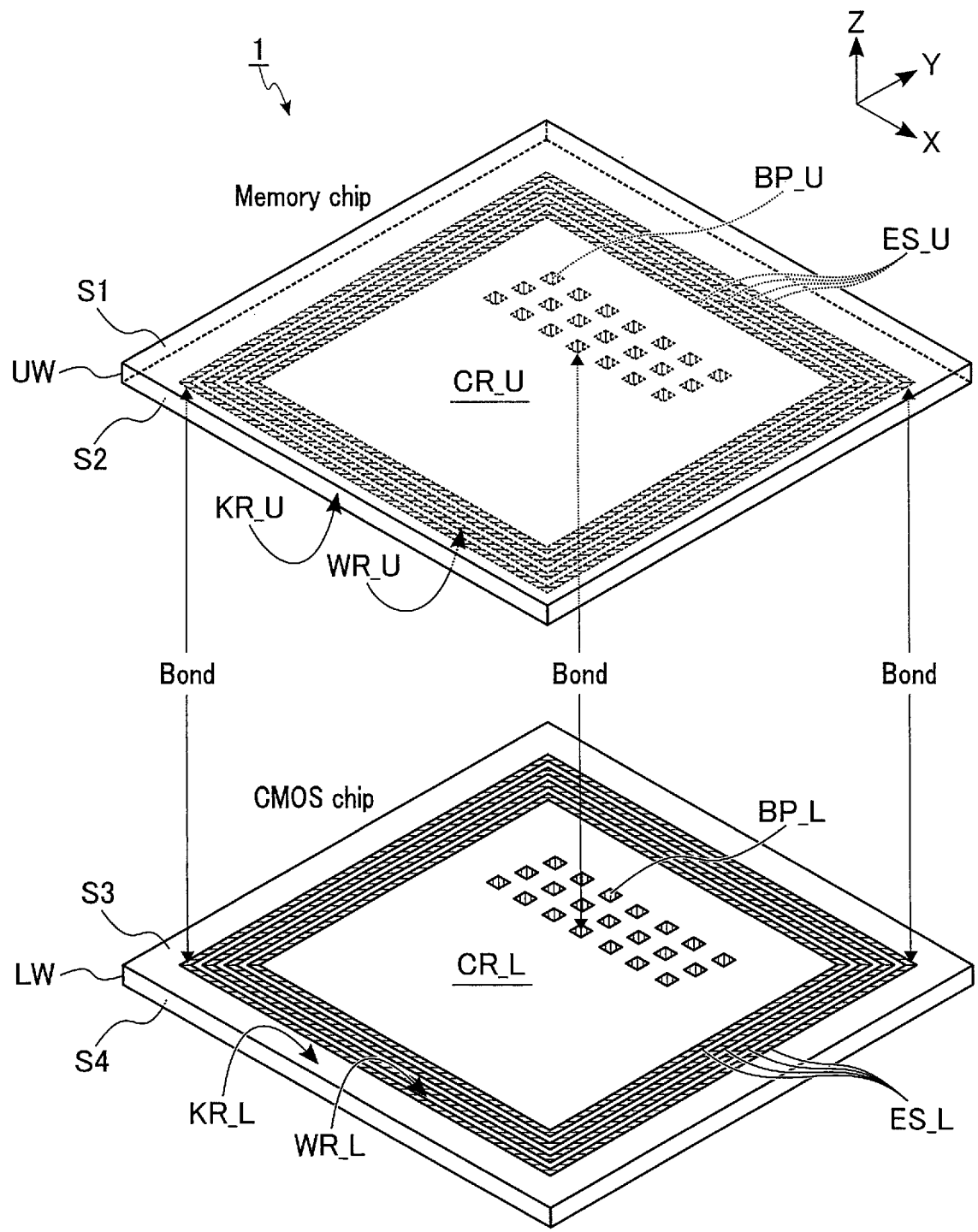
F I G. 27

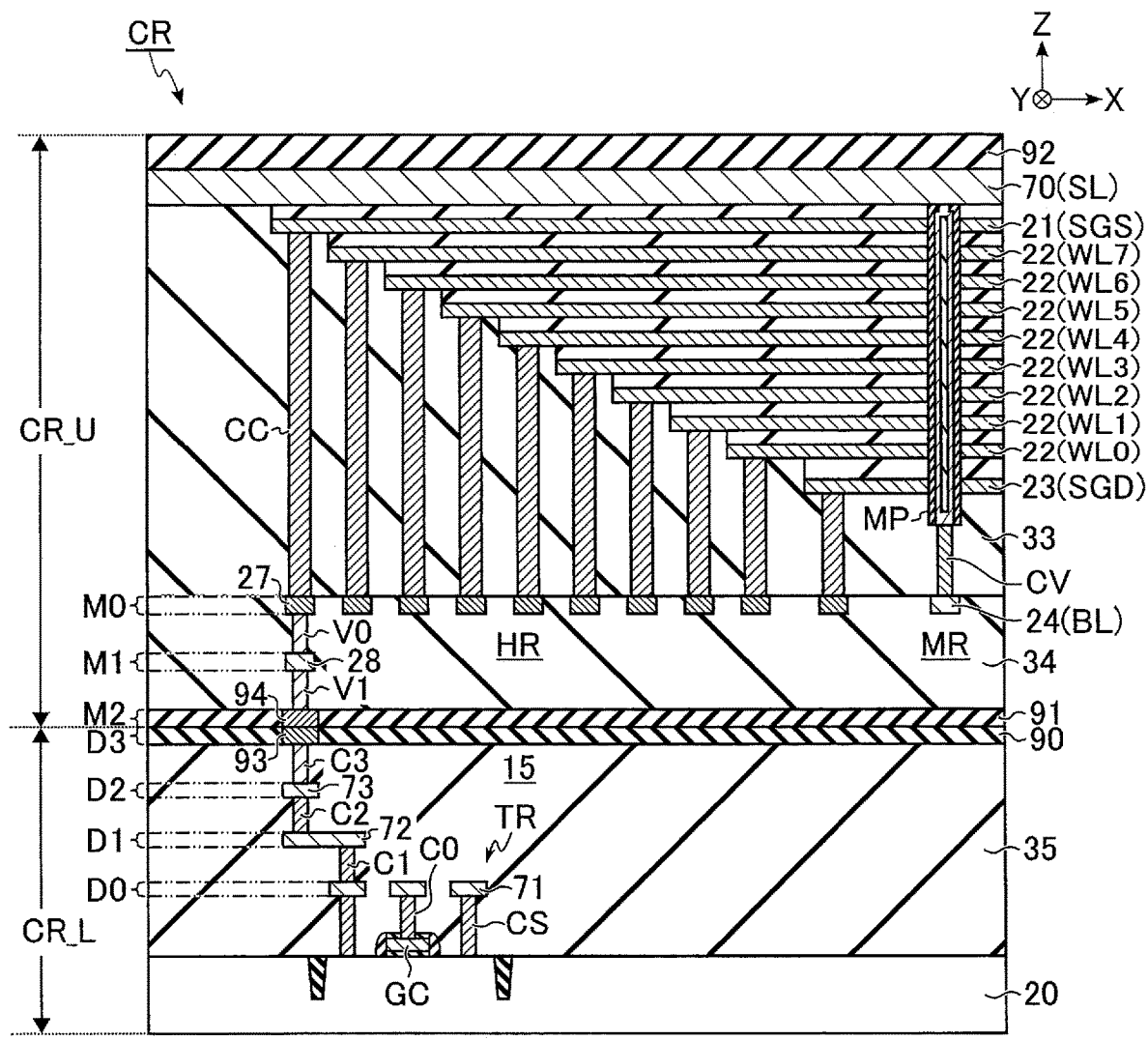
F I G. 28
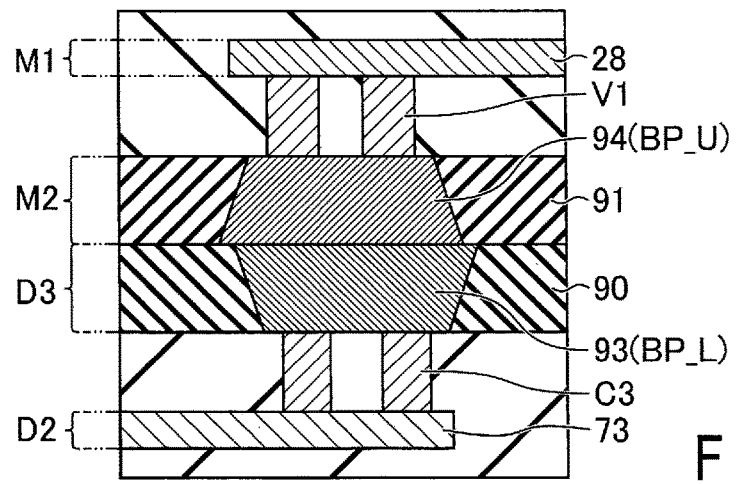
F I G. 29

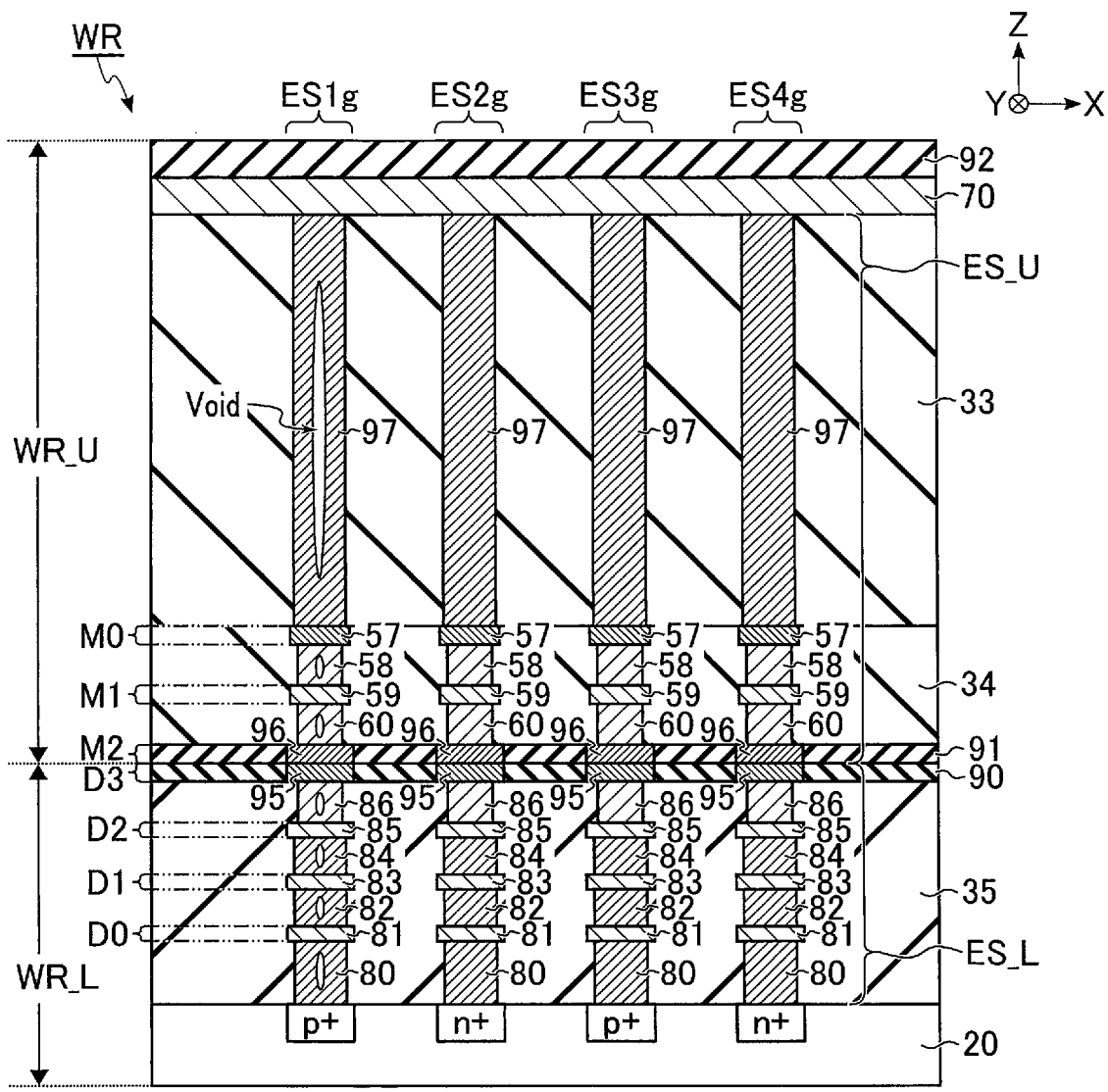
F I G. 30

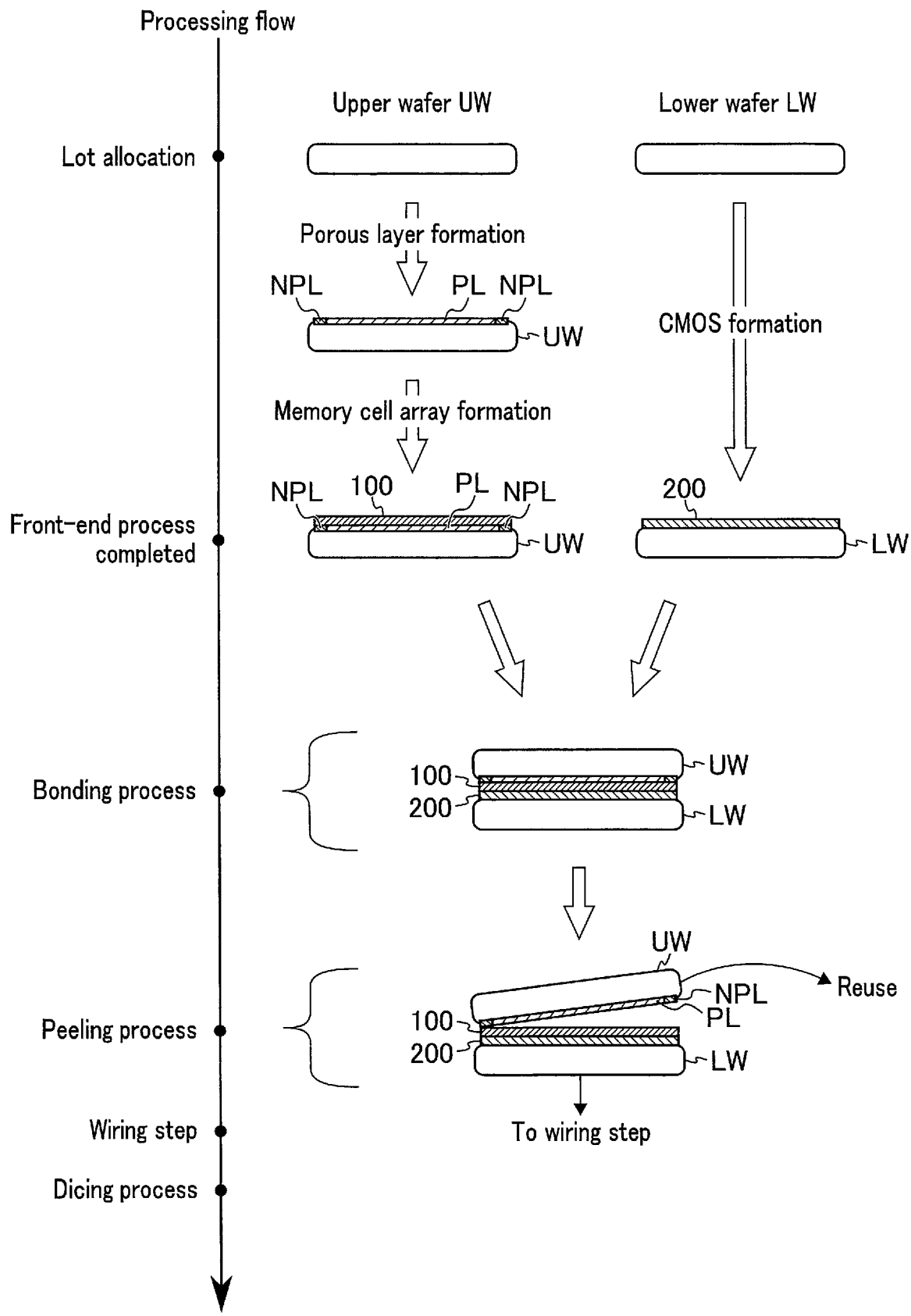
F I G. 31

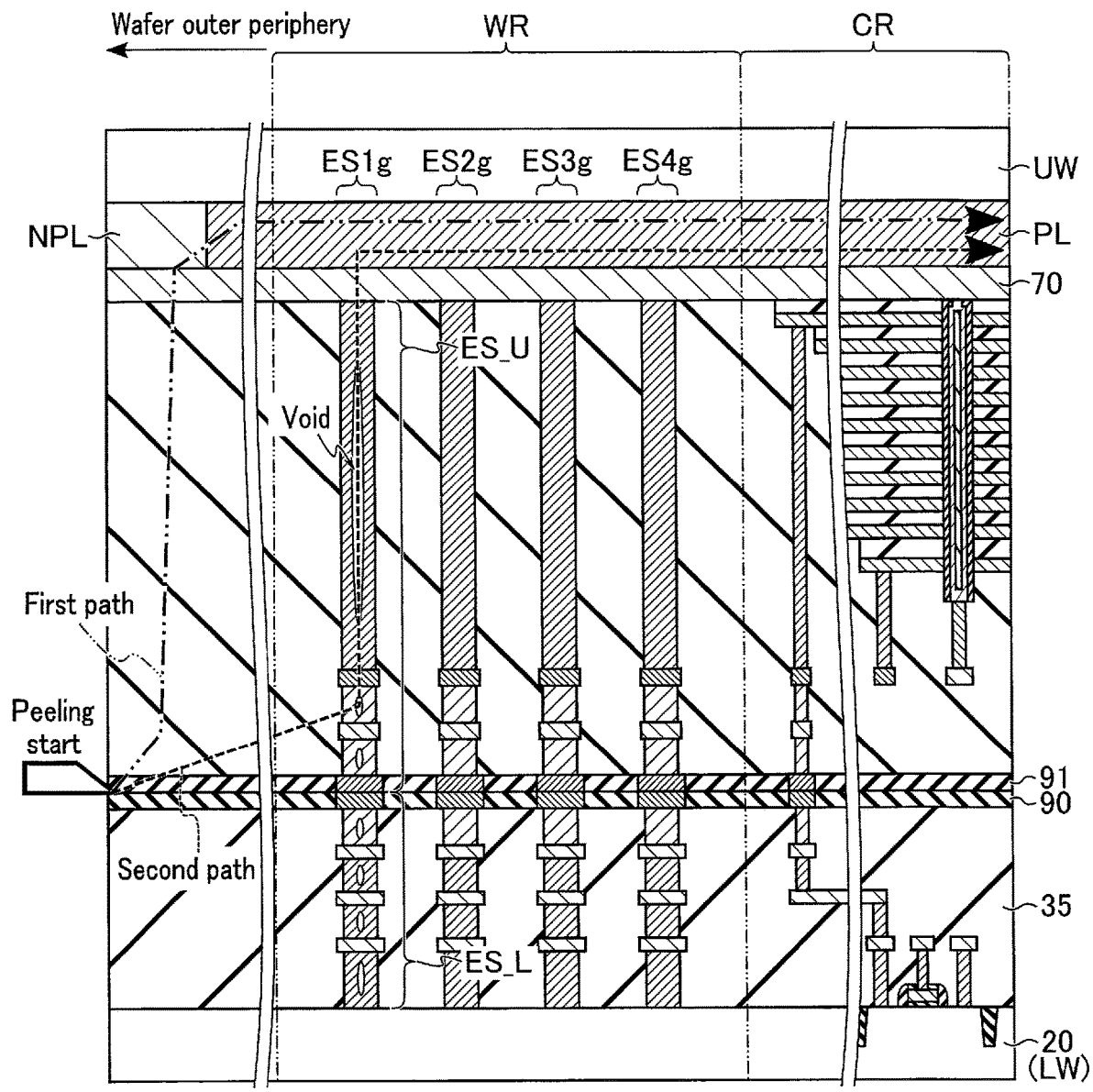
F I G. 32

SEMICONDUCTOR DEVICE

CROSS-REFERENCE TO RELATED APPLICATIONS

This application is based upon and claims the benefit of priority from Japanese Patent Application No. 2022-038300, filed Mar. 11, 2022, the entire contents of which are incorporated herein by reference.

FIELD

Embodiments described herein relate generally to a semiconductor device.

BACKGROUND

There is known a NAND flash memory capable of storing data in a nonvolatile manner.

BRIEF DESCRIPTION OF THE DRAWINGS

FIG. 1 is a block diagram showing an example of an overall configuration of a semiconductor device according to a first embodiment.

FIG. 2 is a circuit diagram showing an example of a circuit configuration of a memory cell array included in the semiconductor device according to the first embodiment.

FIG. 12 is a schematic diagram showing an outline of a manufacturing method of the semiconductor device according to the first embodiment.

FIG. 13 is a plan view showing an example of a detailed chip arrangement in the semiconductor device according to the first embodiment.

FIG. 16 is a schematic diagram showing an example of a path of a crack that occurs during dicing for each of the semiconductor device according to the first embodiment and a semiconductor device according to a comparative example.

FIG. 23 is a schematic diagram showing an example of a third forming method of the sealing portion in the third embodiment.

FIG. 24 is a cross-sectional view showing an example of a cross-sectional structure in a core region of a semiconductor device according to a fourth embodiment.

FIG. 26 is a schematic diagram showing an outline of a manufacturing method of a semiconductor device according to a fifth embodiment.

FIG. 27 is a perspective view showing an example of a bonded structure of the semiconductor device according to the fifth embodiment.

FIG. 28 is a cross-sectional view showing an example of a cross-sectional structure in a core region of the semiconductor device according to the fifth embodiment.

FIG. 29 is a cross-sectional view showing an example of a detailed cross-sectional structure at a bonded portion of the semiconductor device according to the fifth embodiment.

FIG. 30 is a cross-sectional view showing an example of a cross-sectional structure in a wall region of the semiconductor device according to the fifth embodiment.

FIG. 31 is a schematic diagram showing an example of a manufacturing method of a semiconductor device according to a sixth embodiment.

FIG. 32 is a schematic diagram showing an example of a path of a crack that occurs during a peeling process in the semiconductor device according to the sixth embodiment.

DETAILED DESCRIPTION

Figure 3:
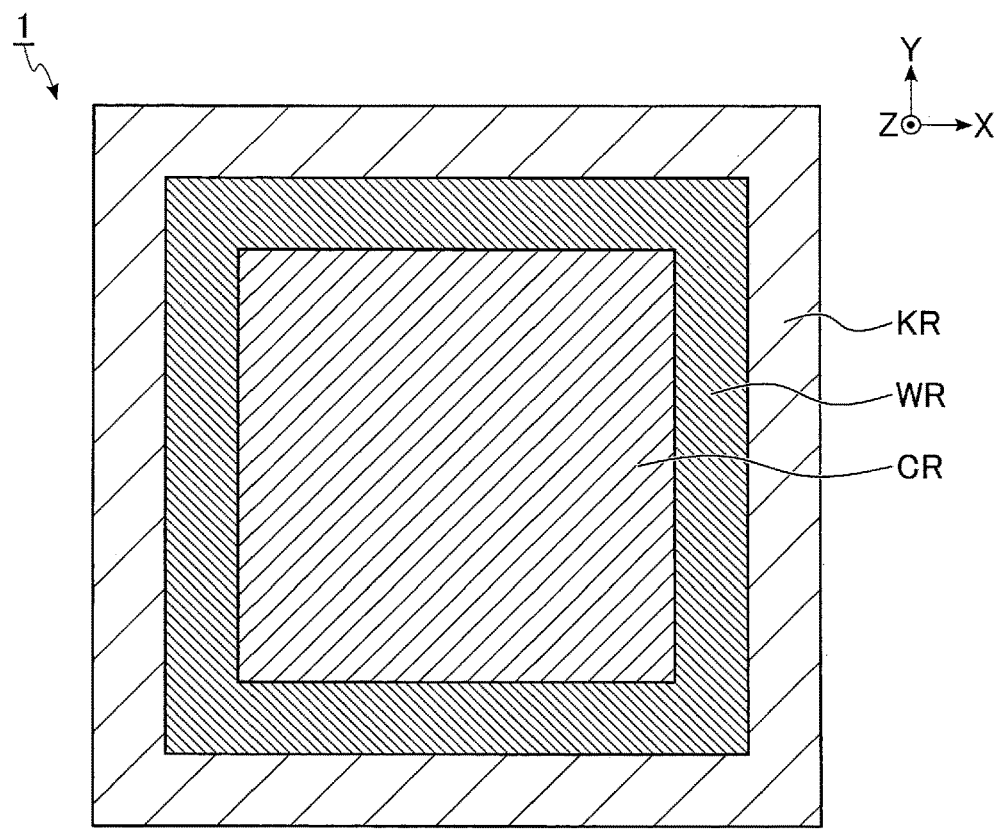
FIG. 3 is a plan view showing an example of a planar layout of the semiconductor device according to the first embodiment.

In general, according to one embodiment, a semiconductor device includes a substrate, a transistor, an insulating layer, and a first sealing portion. The substrate includes a first region, and a second region provided to surround an outer periphery of the first region. The transistor is provided on the substrate in the first region. The insulating layer is provided above the transistor and over the first region and the second region. The first sealing portion is provided to divide the insulating layer and surround the outer periphery of the first region in the second region. The first sealing portion includes a first void.

Hereinafter, embodiments will be described with reference to the drawings. Each embodiment exemplifies a device or method for embodying a technical idea of the invention. The drawings are either schematic or conceptual. The dimensions, ratios, etc. used in the drawings are not necessarily the same as those of the actual products. In the drawings, some structures are omitted as appropriate. The hatching applied in the plan views does not necessarily relate to the material or characteristics of the hatched components. In this specification, structural components having approximately the same function and configuration will be denoted by the same reference sign. The numbers, letters, etc. added to the reference signs are used to distinguish between elements that are referenced by the same reference sign and have a similar configuration.

[1] FIRST EMBODIMENT

In the following, a semiconductor device 1 according to a first embodiment will be described.

[1-1] Configuration

[1-1-1] Overall Configuration of Semiconductor Device 1

FIG. 1 is a block diagram showing an example of an overall configuration of the semiconductor device 1 according to the first embodiment. The semiconductor device 1 is, for example, a NAND flash memory capable of storing data in a nonvolatile manner. The semiconductor device 1 can be controlled by an external memory controller 2. As shown in FIG. 1, the semiconductor device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where "n" is an integer of 1 or more). The block BLK is a set of a plurality of memory cells. The block BLK is used as a unit of data erasure, for example. The memory cell array 10 is provided with a plurality of bit lines and a plurality of word lines. Each memory cell is, for example, associated with one bit line and one word line.

The command register 11 holds a command CMD received by the semiconductor device 1 from the memory controller 2. The command CMD includes, for example, an order to cause the sequencer 13 to execute a read operation, a write operation, an erase operation, etc.

The address register 12 holds address information ADD received by the semiconductor device 1 from the memory controller 2. The address information ADD includes, for example, a block address BAd, a page address PAd, and a column address CAd. For example, the block address BAd, the page address PAd, and the column address CAd are used for selecting a block BLK, a word line, and a bit line, respectively.

The sequencer 13 controls the operation of the entire semiconductor device 1. For example, the sequencer 13 controls the driver module 14, the row decoder module 15, the sense amplifier module 16, etc., based on a command CMD held in the command register 11, and executes a read operation, a write operation, an erase operation, etc.

The driver module 14 generates a voltage used in a read operation, a write operation, an erase operation, etc. The driver module 14 applies the generated voltage to a signal line corresponding to a selected word line based on, for example, a page address PAd held in the address register 12.

The row decoder module 15 selects one corresponding block BLK in the memory cell array 10, based on a block address BAd held in the address register 12. Then, the row decoder module 15 transfers, for example, the voltage applied to the signal line corresponding to the selected word line to the selected word line in the selected block BLK.

The sense amplifier module 16 applies a desired voltage to each bit line in accordance with write data DAT received from the memory controller 2 in a write operation. Furthermore, in a read operation, the sense amplifier module 16 determines data stored in a memory cell based on a voltage of a bit line, and transfers the determination result to the memory controller 2 as read data DAT.

The semiconductor memory device 1 and the memory controller 2 may form, in combination, a single semiconductor device. Examples of such semiconductor devices include a memory card such as an SD™ card and a solid state drive (SSD), etc.

[1-1-2] Circuit Configuration of Memory Cell Array 10

FIG. 2 is a circuit diagram showing an example of a circuit configuration of the memory cell array 10 included in the semiconductor device 1 according to the first embodiment. FIG. 2 shows one block BLK of the plurality of blocks BLK included in the memory cell array 10. As shown in FIG. 2, the block BLK includes, for example, five string units SU0 to SU4. Each of select gate lines SGD0 to SGD4 and SGS and word lines WL0 to WL7 is provided for each block BLK. Bit lines BL0 to BLm and a source line SL are shared by a plurality of blocks BLK.

Each string unit SU includes a plurality of NAND strings NS. A plurality of NAND strings NS are respectively associated with the bit lines BL0 to BLm (where "m" is an integer of 1 or more). That is, each bit line BL is shared by the NAND strings NS to which the same column address is assigned from among a plurality of blocks BLK. Each NAND string NS is coupled between associated bit line BL and source line SL. Each NAND string NS includes, for example, memory cell transistors MT0 to MT7 and select transistors STD and STS. Each memory cell transistor MT includes a control gate and a charge storage layer, and holds (stores) data in a nonvolatile manner. Each of the select transistors STD and STS is used for selecting a string unit SU.

In each NAND string NS, the select transistor STD, memory cell transistors MT7 to MT0, and select transistor STS are, in this order, coupled in series. Specifically, the drain and source of the select transistor STD are coupled to an associated bit line BL and the drain of the memory cell transistor MT7, respectively. The drain and source of the select transistor STS are coupled to the source of the memory cell transistor MT0 and the source line SL, respectively. The memory cell transistors MT0 to MT7 are coupled in series between the select transistors STD and STS.

The select gate lines SGD0 to SGD4 are associated with the string units SU0 to SU4, respectively. Each select gate line SGD is coupled to the gate of each of a plurality of select transistors STD included in an associated string unit SU. The select gate line SGS is coupled to the gate of each of a plurality of select transistors STS included in an associated block BLK. The word lines WL0 to WL7 are coupled to the control gates of the memory cell transistors MT0 to MT7, respectively.

A set of a plurality of memory cell transistors MT coupled to a common word line WL in one string unit SU is referred to as, for example, a "cell unit CU". For example, in a case where each memory cell transistor MT stores 1-bit data, a storage capacity of a cell unit CU is defined as "1-page data". The cell unit CU can have a storage capacity of 2-page data or more according to the number of bits of data stored in each memory cell transistor MT.

The memory cell array 10 included in the semiconductor device 1 according to the first embodiment may have other circuit configurations. For example, the number of string units SU included in each block BLK and the numbers of memory cell transistors MT and select transistors STD and STS included in each NAND string NS may be freely designed.

[1-1-3] Structure of Semiconductor Device 1

An example of a structure of the semiconductor device 1 according to the first embodiment will be described below. In the drawings to be referred to below, a three-dimensional orthogonal coordinate system will be used. An X direction corresponds to a direction in which the word lines WL extend. A Y direction corresponds to a direction in which the bit lines BL extend. A Z direction corresponds to a direction vertical to a surface of a wafer (semiconductor substrate 20) used for forming the semiconductor device 1. In this specification, "top and bottom" are defined based on a direction along the Z direction.

(Planar Layout of Semiconductor Device 1)

FIG. 3 is a plan view showing an example of a planar layout of the semiconductor device 1 according to the first embodiment. As shown in FIG. 3, the planar layout of the semiconductor device 1 includes, for example, a core region CR, a wall region WR, and a kerf region KR.

The core region CR is, for example, a rectangular region provided near a central part of the semiconductor substrate 20. In the core region CR, the memory cell array 10, the command register 11, the address register 12, the sequencer 13, the driver module 14, the row decoder module 15, the sense amplifier module 16, etc. are arranged.

The wall region WR is a square ring-shaped region provided to surround an outer periphery of the core region CR. In the wall region WR, at least one sealing portion ES (not shown) provided to surround the outer periphery of the core region CR is arranged. Details of the sealing portion ES will be described later.

The kerf region KR is a square ring-shaped region provided to surround an outer periphery of the wall region WR. The kerf region KR contacts the outermost periphery of the semiconductor device 1. In the kerf region KR, for example, an alignment mark used during manufacturing of the semiconductor device 1, etc. is arranged. The structure of the kerf region KR may be removed by a dicing process to be described later.

(Planar Layout in Core Region CR of Semiconductor Device 1)

Figure 4:
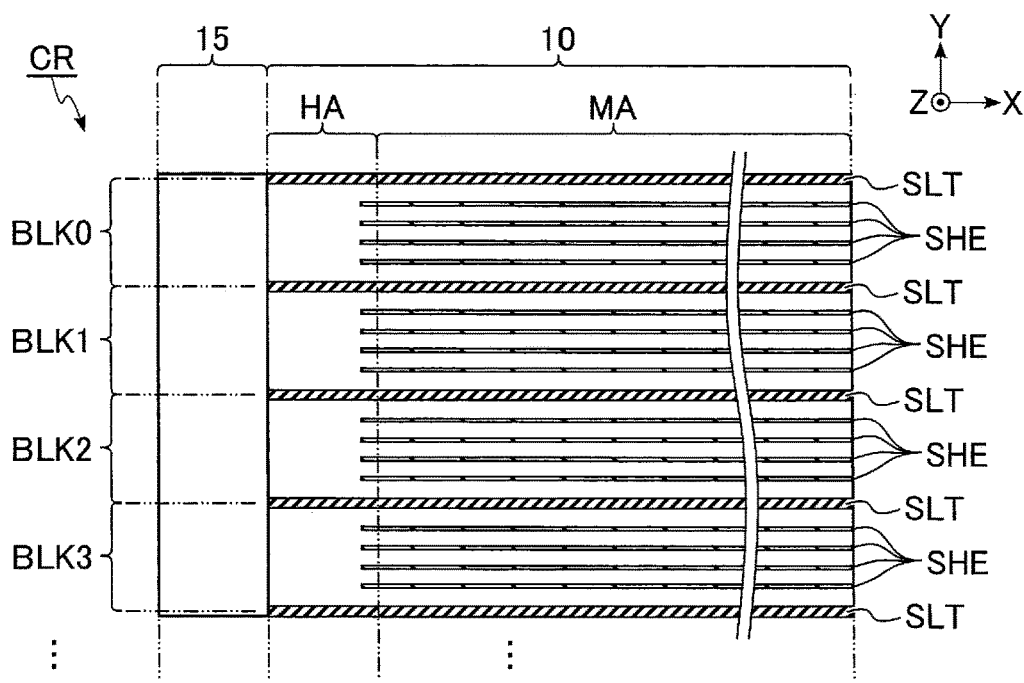
FIG. 4 is a plan view showing an example of a planar layout in a core region of the semiconductor device according to the first embodiment.

FIG. 4 is a plan view showing an example of a planar layout in the core region CR of the semiconductor device 1 according to the first embodiment. FIG. 4 shows regions corresponding to four blocks BLK0 to BLK3 included in the memory cell array 10. As shown in FIG. 4, in the core region CR, the memory cell array 10 and the row decoder module 15 are adjacent in the X direction. The memory cell array 10 includes a plurality of slits SLT and a plurality of slits SHE.

The planar layout of the memory cell array 10 includes, for example, a memory area MA and a hookup area HA. The memory area MA is adjacent to the hookup area HA in the X direction. The memory area MA is an area in which a plurality of NAND strings NS are arranged. The hookup area HA is an area used for coupling between stacked interconnects including the word lines WL and select gate lines SGD and SGS and the row decoder module 15.

Each slit SLT has a portion extending along the X direction, and crosses the memory area MA and the hookup area HA along the X direction. The slits SLT are arranged in the Y direction. Each slit SLT has, for example, a structure into which an insulator and a plate-shaped contact are embedded. Each slit SLT divides interconnects (e.g., the word lines WL0 to WL7 and select gate lines SGD and SGS) that are adjacent to each other via that slit SLT. In the memory cell array 10, each of regions separated by the slits SLT corresponds to one block BLK.

Each slit SHE has a portion extending along the X direction, and crosses the memory area MA along the X direction. The slits SHE are arranged in the Y direction. In this example, four slits SHE are arranged between any two slits SLT adjacent in the Y direction. Each slit SHE has a structure into which an insulator is embedded, for example. Each slit SHE divides interconnects (at least the select gate line SGD) that are adjacent to each other via that slit SHE. In the memory cell array 10, each of the regions separated by the slits SLT and SHE corresponds to one string unit SU.

The planar layout of the memory cell array 10 included in the semiconductor device 1 according to the first embodiment may be other layouts. For example, the memory cell array 10 may include a plurality of hookup areas HA. The number of slits SHE arranged between any two adjacent slits SLT may be freely designed. The number of string units SU included in each block BLK may be changed based on the number of slits SHE arranged between any two adjacent slits SLT.

(Planar Layout in Memory Area MA of Semiconductor Device 1)

Figure 5:
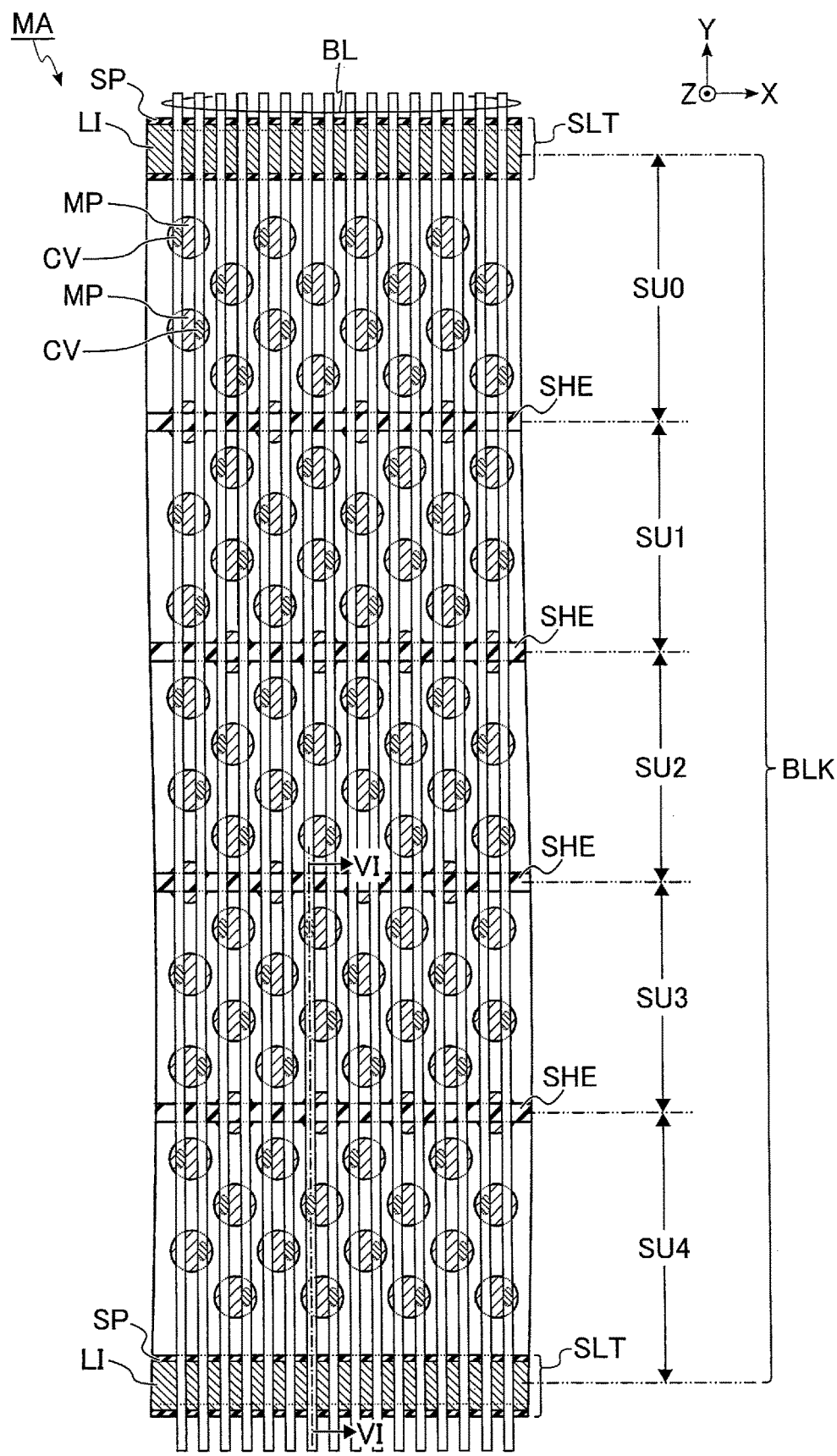
FIG. 5 is a plan view showing an example of a planar layout in a memory area of the semiconductor device according to the first embodiment.

FIG. 5 is a plan view showing an example of a planar layout in the memory area MA of the semiconductor device 1 according to the first embodiment. FIG. 5 shows an area including one block BLK (string units SU0 to SU4). As shown in FIG. 5, the semiconductor device 1 includes, for example, a plurality of memory pillars MP, a plurality of contacts CV, and a plurality of bit lines BL in the memory area MA. Each slit SLT includes a contact LI and a spacer SP.

Each memory pillar MP functions as one NAND string NS. A plurality of memory pillars MP are in, for example, a 24-row staggered arrangement in an area between any two adjacent slits SLT. For example, a single slit SHE overlaps each set of the memory pillars MP in the fifth row, the memory pillars MP in the tenth row, the memory pillars MP in the fifteenth row, and the memory pillars MP in the twentieth row, counting from the upper side of the drawing sheet.

Each bit line BL is a conductor having a portion extending in the Y direction. A plurality of bit lines are arranged in the X direction. Each bit line BL is arranged to overlap at least one memory pillar MP for each string unit SU. In this example, two bit lines BL overlap each memory pillar MP. One of a plurality of bit lines BL that overlap a memory pillar MP and the memory pillar MP are electrically coupled via a contact CV. A contact CV may be omitted between a memory pillar MP, which is in contact with two different select gate lines SGD, and a bit line BL.

The contact LI is a conductor having a portion extending in the X direction. The spacers SP are insulators provided on side surfaces of the contact LI. In the illustrated area, the contact LI is sandwiched by the spacers SP in the Y direction. The contact LI is separated and insulated by the spacers SP from conductors (e.g. the word lines WL0 to WL7, and the select gate lines SGD and SGS) that are adjacent to that contact LI in the Y direction. The spacer SP is, for example, an oxide film.

The planar layout in the memory area MA of the semiconductor device 1 according to the first embodiment may be other layouts. For example, the number and arrangement of memory pillars MP, slits SHE, etc. provided between any two adjacent slits SLT may be changed as appropriate. The number of bit lines BL overlapping each memory pillar MP may be freely designed.

(Cross-Sectional Structure in Memory Area MA of Semiconductor Device 1)

Figure 6:
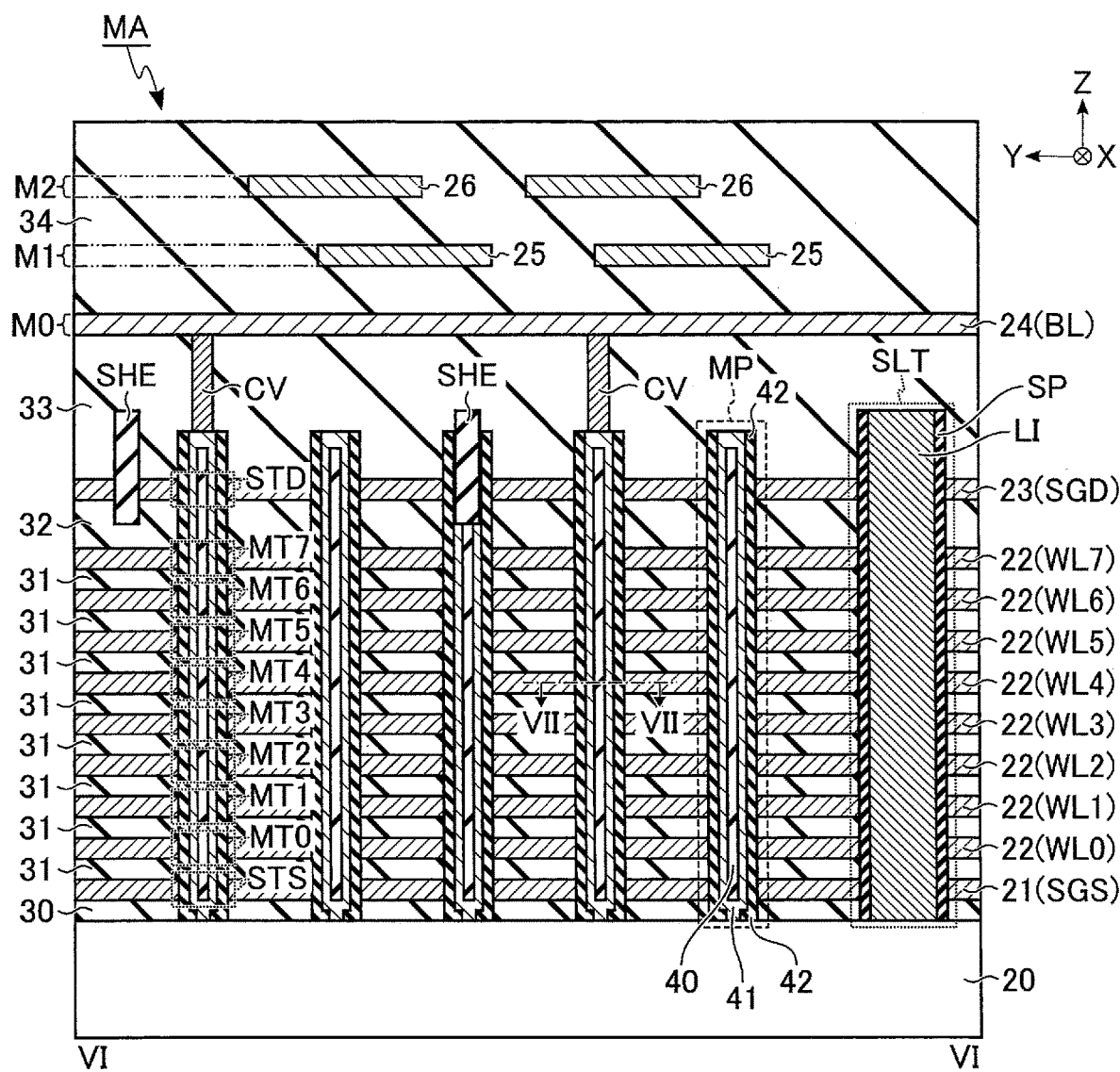
FIG. 6 is a cross-sectional view taken along line VI-VI of FIG. 5, showing an example of a cross-sectional structure in the memory area of the semiconductor device according to the first embodiment.

FIG. 6 is a cross-sectional view taken along line VI-VI of FIG. 5, showing an example of a cross-sectional structure in the memory area MA of the semiconductor device 1 according to the first embodiment. As shown in FIG. 6, the semiconductor device 1 includes, for example, the semiconductor substrate 20, conductive layers 21 to 26, and insulating layers 30 to 34 in the memory area MA.

The semiconductor substrate 20 is, for example, a P-type silicon substrate. The insulating layer 30 is provided on the semiconductor substrate 20. The conductive layer 21 is provided on the insulating layer 30. The conductive layer 21 is formed in a plate shape expanding along the XY plane, for example, and is used as the select gate line SGS. The conductive layer 21 contains, for example, tungsten.

The insulating layers 31 and the conductive layers 22 are alternately stacked on the conductive layer 21. The conductive layers 22 are each formed, for example, in a plate shape expanding along the XY plane. The stacked conductive layers 22 are used as the word lines WL0 to WL7, respectively, in order from the semiconductor substrate 20 side. The conductive layers 22 contain, for example, tungsten.

The insulating layer 32 is provided on the uppermost conductive layer 22 (i.e., the word line WL7). The conductive layer 23 is provided on the insulating layer 32. The conductive layer 23 is formed in a plate shape expanding along the XY plane, for example, and is used as the select gate line SGD. The conductive layer 23 contains, for example, tungsten.

The insulating layer 33 is provided on the conductive layer 23. The conductive layer 24 is provided on the insulating layer 33. The conductive layer 24 is formed into, for example, a linear shape extending in the Y direction, and is used as a bit line BL. In an unillustrated area, a plurality of conductive layers 24 are arranged in the X direction. The conductive layer 24 contains, for example, copper. Hereinafter, an interconnect layer provided with the conductive layer 24 will be referred to as "M0".

The insulating layer 34 is provided on the conductive layer 24. The insulating layer 34 includes an interconnect for coupling the memory cell array 10 and the row decoder module 15, etc. The insulating layer 34 includes, for example, a plurality of conductive layers 25 and a plurality of conductive layers 26. The conductive layers 25 are provided in a layer of a higher level than the conductive layer 24, and are spaced apart from the conductive layer 24. The conductive layers 26 are provided in a layer of a higher level than the conductive layers 25, and are spaced apart from the conductive layers 25. Hereinafter, interconnect layers in which the conductive layers 25 and 26 are provided will be referred to as "M1" and "M2", respectively.

Each memory pillar MP is provided to extend along the Z direction. Each memory pillar MP penetrates the insulating layers 30 to 32 and the conductive layers 21 to 23. The bottom portion of each memory pillar MP reaches the semiconductor substrate 20. A portion where the memory pillar MP intersects the conductive layer 21 functions as a select transistor STS. A portion where the memory pillar MP intersects each conductive layer 22 functions as a memory cell transistor MT. A portion where the memory pillar MP intersects the conductive layer 23 functions as a select transistor STD.

Further, each memory pillar MP includes, for example, a core member 40, a semiconductor layer 41, and a stacked film 42. The core member 40 is provided to extend along the Z direction. The semiconductor layer 41 covers the periphery of the core member 40. A bottom portion of the semiconductor layer 41 is in contact with the semiconductor substrate 20. The stacked film 42 covers the side and bottom surfaces of the semiconductor layer 41, excluding the portion where the semiconductor layer 41 is in contact with the semiconductor substrate 20. The core member 40 contains an insulator such as a silicon oxide. The semiconductor layer 41 contains, for example, silicon.

The contact CV is provided in a columnar shape extending along the Z direction. Each contact CV is provided on the semiconductor layer 41 of the memory pillar MP. In the illustrated area, two contacts CV respectively corresponding to two of the six memory pillars MP are shown. A top surface of each contact CV is in contact with one conductive layer 24. The memory pillar MP provided between adjacent slits SLT and SHE, and the memory pillar MP provided between two adjacent slits SHE, are electrically coupled to each conductive layer 24.

The slit SLT includes a portion provided along the XZ plane, for example, and divides the conductive layers 21 to 23 and the insulating layers 30 to 32. The contact LI in the slit SLT is provided along the slit SLT. An upper end of the contact LI is provided at a height between an upper end of the memory pillar MP and the conductive layer 24. A lower end of the contact LI is in contact with the semiconductor substrate 20. The semiconductor substrate 20 may have an impurity diffusion region at the portion where the semiconductor substrate 20 is in contact with the contact LI. The contact LI is used, for example, as a part of the source line SL. The contact LI and the conductive layers 21 to 23 are separated and insulated by the spacer SP.

The slit SHE includes a portion provided along the XZ plane, for example, and divides at least the conductive layer 23. An upper end of the slit SHE is provided at a height between the upper end of the memory pillar MP and the conductive layer 24. A lower end of the slit SHE is provided at a height of the insulating layer 32. The slit SHE contains an insulator such as a silicon oxide. The upper end of the slit SHE and the upper end of the slit SLT may or may not be aligned. The upper end of the slit SHE and the upper end of the memory pillar MP may or may not be aligned.

(Cross-Sectional Structure of Memory Pillar MP)

Figure 7:
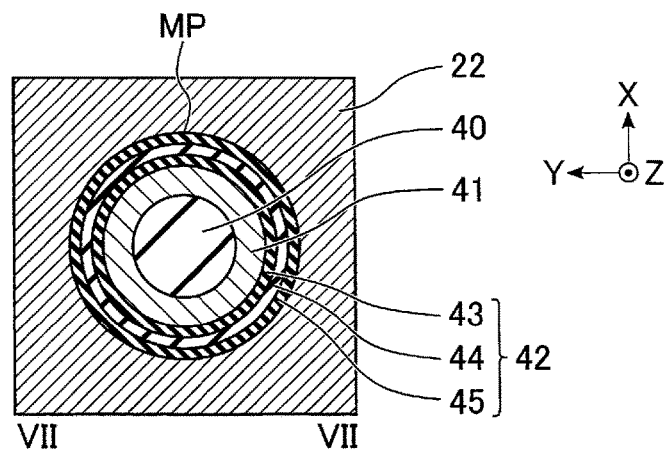
FIG. 7 is a cross-sectional view taken along line VII-VII of FIG. 6, showing an example of a cross-sectional structure of a memory pillar included in the semiconductor device according to the first embodiment.

FIG. 7 is a cross-sectional view taken along line VII-VII of FIG. 6, showing an example of a cross-sectional structure of the memory pillar MP included in the semiconductor device 1 according to the first embodiment. FIG. 7 shows a cross-sectional structure of the memory pillar MP in a layer parallel to the surface of the semiconductor substrate 20 and including the conductive layer 22. As shown in FIG. 7, the stacked film 42 includes, for example, a tunnel insulating film 43, an insulating film 44, and a block insulating film 45.

The core member 40 is provided in the central portion of the memory pillar MP. The semiconductor layer 41 surrounds the side surface of the core member 40. The tunnel insulating film 43 surrounds a side surface of the semiconductor layer 41. The insulating film 44 surrounds a side surface of the tunnel insulating film 43. The block insulating film 45 surrounds a side surface of the insulating film 44. The conductive layer 22 surrounds a side surface of the block insulating film 45. The tunnel insulating film 43 and the block insulating film 45 both contain, for example, a silicon oxide. The insulating film 44 contains, for example, a silicon nitride.

In each of the memory pillars MP described above, the semiconductor layer 41 is used as a channel (current path) of the memory cell transistors MT0 to MT7 and the select transistors STD and STS. The insulating film 44 is used as a charge storage layer of the memory cell transistors MT. The semiconductor device 1 can cause a current to flow via the memory pillar MP between the bit line BL and the contact LI (source line SL) by turning on the memory cell transistors MT0 to MT7 and the select transistors STD and STS.

(Planar Layout in Hookup Area HA of Semiconductor Device 1)

Figure 8:
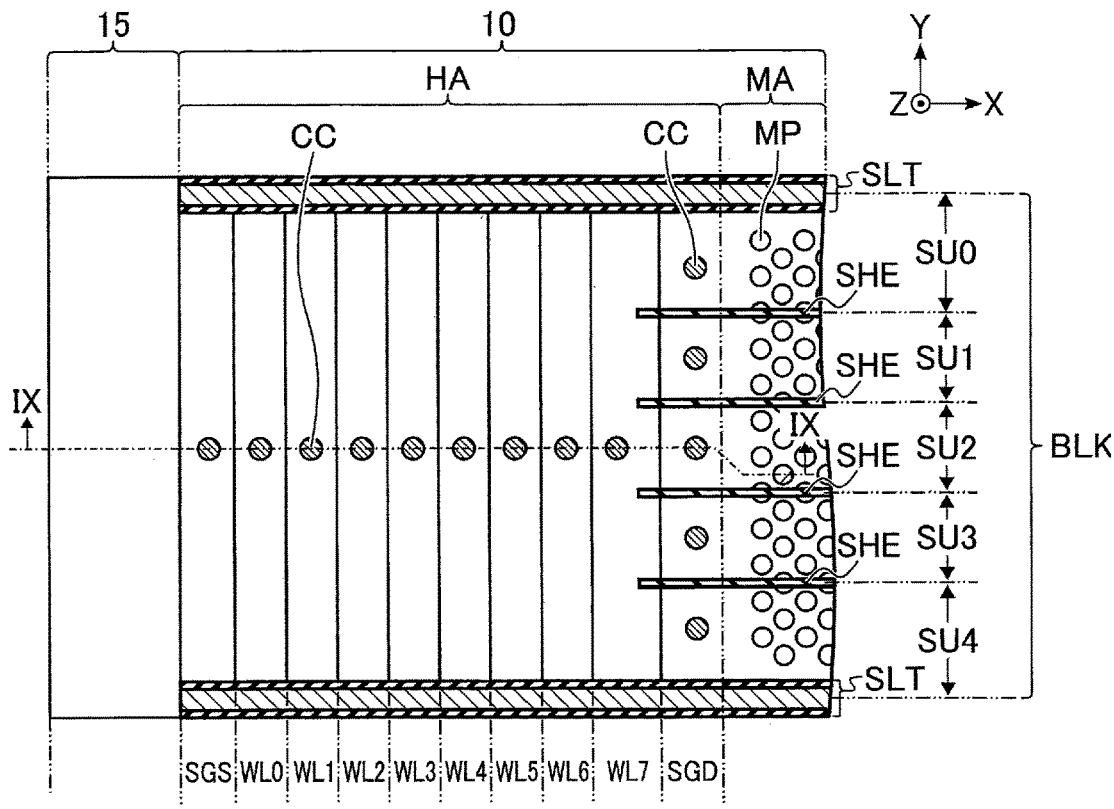
FIG. 8 is a plan view showing an example of a planar layout in a hookup area of the semiconductor device according to the first embodiment.

FIG. 8 is a plan view showing an example of a planar layout in the hookup area HA of the semiconductor device 1 according to the first embodiment. FIG. 8 shows an area of the row decoder module 15 and the memory area MA in the vicinity of the hookup area HA together. As shown in FIG. 8, in the hookup area HA, an end portion of each of the select gate line SGS, word lines WL0 to WL7, and select gate line SGD includes a terraced portion.

The terraced portion corresponds to a portion not overlapping an interconnect layer (conductive layer) of a higher level among the stacked interconnects. A structure formed by a plurality of terraced portions is similar to a step, a terrace, a rimstone, etc. In this example, a staircase structure having level differences in the X direction is formed by an end portion of the select gate line SGS, end portions of the word lines WL0 to WL7, and an end portion of the select gate line SGD. In other words, the level differences are formed between the select gate line SGS and the word line WL0, between the word line WL0 and the word line WL1, . . . , between the word line WL6 and the word line WL7, and between the word line WL7 and the select gate line SGD, respectively.

In addition, in the hookup area HA, the semiconductor device 1 includes a plurality of contacts CC. The contact CC is a member used for coupling between the row decoder module 15 and the stacked interconnects. Each contact CC is coupled to any one of the stacked interconnects provided in the memory cell array 10, i.e., the terraced portions of the conductive layers 21 to 23.

(Cross-Sectional Structure in Hookup Area HA and its Vicinity of Semiconductor Device 1)

Figure 9:
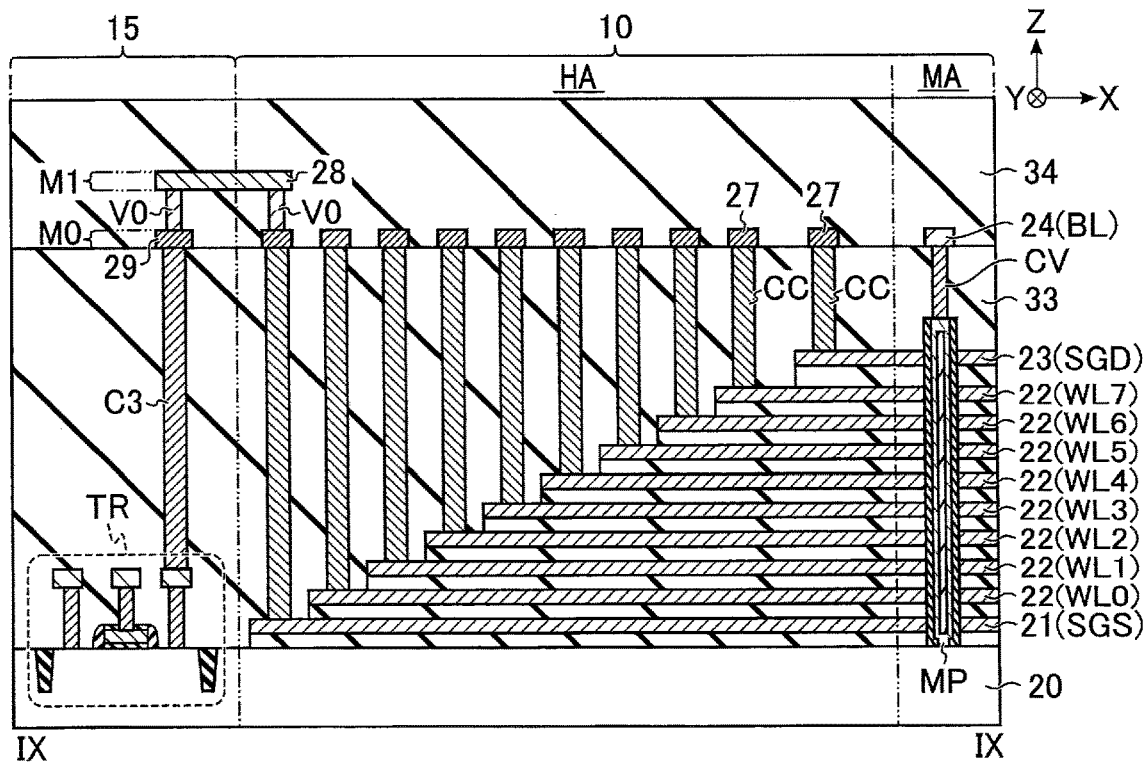
FIG. 9 is a cross-sectional view taken along line IX-IX of FIG. 8, showing an example of a cross-sectional structure in the hookup area and its vicinity of the semiconductor device according to the first embodiment.

FIG. 9 is a cross-sectional view taken along line IX-IX of FIG. 8, showing an example of a cross-sectional structure in the hookup area HA and its vicinity of the semiconductor device 1 according to the first embodiment. As shown in FIG. 9, the semiconductor device 1 includes a plurality of conductive layers 27, conductive layers 28 and 29, a plurality of contacts V0, a contact C3, and a transistor TR in the area of the row decoder module 15 and the hookup area HA. An end portion of each of the conductive layers 21 to 23 is provided in a staircase pattern, and is covered by the insulating layer 33. The conductive layers 27, conductive layers 28 and 29, and contacts V0 are covered by the insulating layer 34.

The contacts CC are provided on the terraced portions of the select gate line SGS, word lines WL0 to WL7, and select gate line SGD, respectively. Each contact CC penetrates the insulating layer 33. That is, the insulating layer 33 is provided over the core region CR and the wall region WR. Each of the contacts CC is provided with, on its top, a single conductive layer 27. The conductive layer 27 is, for example, included in the interconnect layer M0. The contact V0 is provided on the conductive layer 27. FIG. 9 shows a contact V0 corresponding to the select gate line SGS among the plurality of contacts V0. The conductive layer 28 is provided on the contact V0. The conductive layer 28 is an interconnect having a portion extending toward the row decoder module 15 from the hookup area HA. The conductive layer 28 is, for example, included in the interconnect layer M1.

The transistor TR is provided on the semiconductor substrate 20 in the area of the row decoder module 15. The transistor TR is included in the row decoder module 15, and is used for transferring a voltage to any one of the stacked interconnects. The contact C3 is provided on an interconnect coupled to a source region of the transistor TR. The contact C3 penetrates a part of the insulating layer 33. The conductive layer 29 is provided on the contact C3. The conductive layer 29 is, for example, included in the interconnect layer M0. The conductive layer 29 is coupled to the conductive layer 28 via the contact V0. That is, for the contact V0 provided in the area of the row decoder module 15, a bottom portion is in contact with the conductive layer 29 and an upper portion is in contact with the conductive layer 28.

By the structures of the memory cell array 10 and the row decoder module 15 described above, the conductive layer 21 corresponding to the select gate line SGS is electrically coupled to the transistor TR via the contacts CC, V0, and C3 and conductive layers 27, 28, and 29. Similarly, each of the conductive layers 22 and 23 included in the stacked interconnects is coupled to the transistor within the row decoder module 15 via the contact CC, the conductive layer 27, etc.

(Planar layout in Wall Region WR of Semiconductor Device 1)

Figure 10:
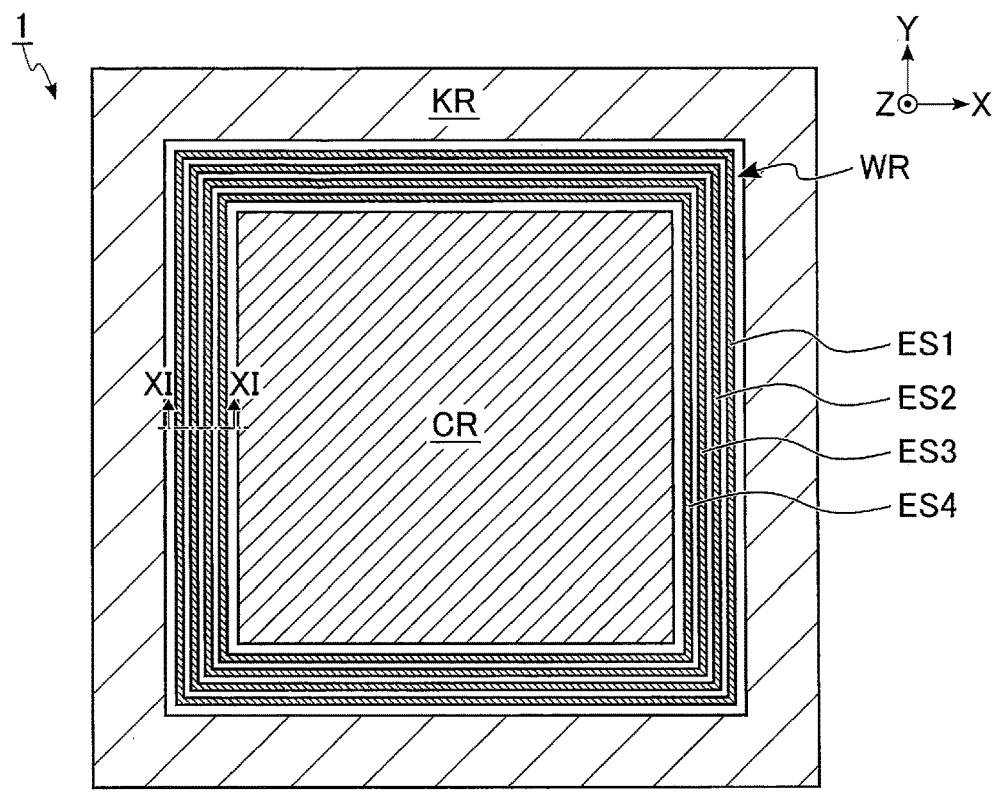
FIG. 10 is a plan view showing an example of a planar layout in a wall region of the semiconductor device according to the first embodiment.

FIG. 10 is a plan view showing an example of a planar layout in the wall region WR of the semiconductor device 1 according to the first embodiment. FIG. 10 shows the same region as the planar layout of the semiconductor device 1 shown in FIG. 3. As shown in FIG. 10, the semiconductor device 1 includes, for example, a plurality of sealing portions ES1, ES2, ES3, and ES4 in the wall region WR.

Each of the sealing portions ES1, ES2, ES3, and ES4 is, for example, a structure (member) capable of releasing positive or negative charge generated inside and outside the wall region WR to the semiconductor substrate 20. Each sealing portion ES can also be used as a crack stopper in a dicing process. Each sealing portion ES is provided in a square ring shape in a manner to surround the outer periphery of the core region CR. The plurality of sealing portions ES are spaced apart from each other and arranged in a concentric ring shape.

Specifically, the sealing portion ES4 surrounds the outer periphery of the core region CR. The sealing portion ES3 surrounds an outer periphery of the sealing portion ES4. The sealing portion ES2 surrounds an outer periphery of the sealing portion ES3. The sealing portion ES1 surrounds an outer periphery of the sealing portion ES2. That is, the sealing portion ES1 corresponds to a sealing portion ES that is closest to the kerf region KR among the plurality of sealing portions ES. The sealing portion ES4 corresponds to a sealing portion ES that is closest to the core region CR among the plurality of sealing portions ES.

Each sealing portion ES can suppress permeation of moisture, etc. from the outside of the wall region WR into the core region CR. Each sealing portion ES can suppress stress generated in an interlayer insulating film (e.g., tetraethoxysilane (TEOS)) of the semiconductor device 1. The structure provided in the sealing portion ES may be referred to as an "edge seal", "crack stopper", or "sealing member". (Cross-sectional Structure in Wall Region WR of Semiconductor Device 1)

Figure 11:
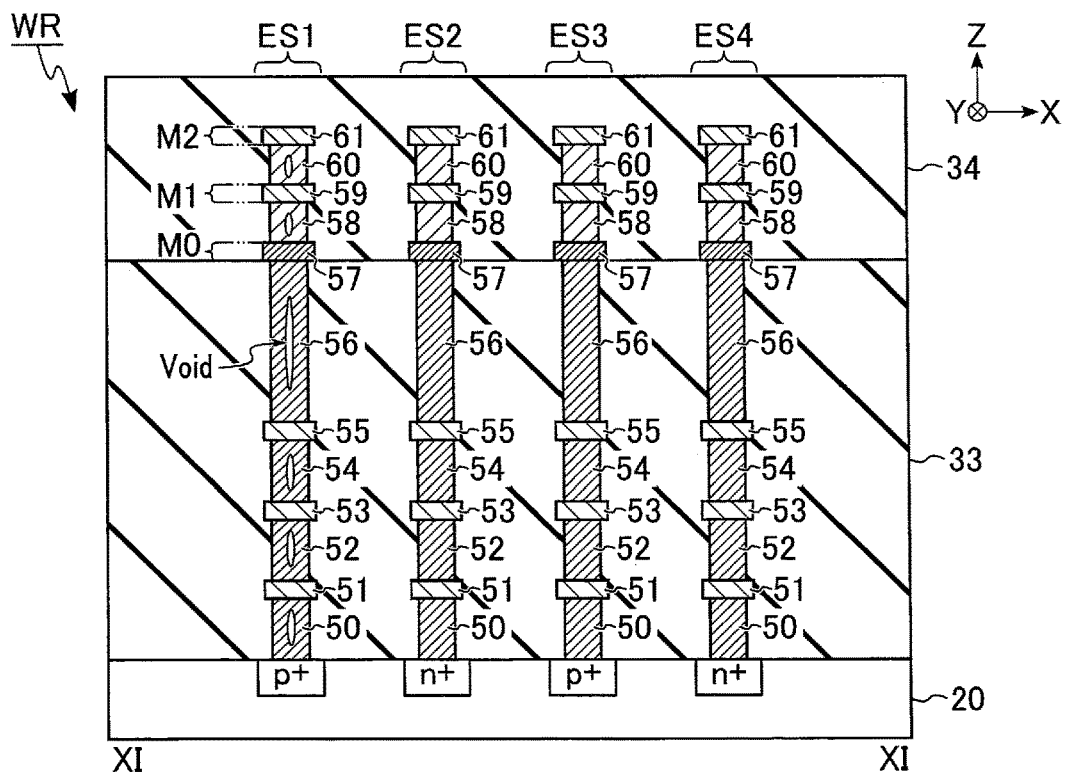
FIG. 11 is a cross-sectional view taken along line XI-XI of FIG. 10, showing an example of a cross-sectional structure in the wall region of the semiconductor device according to the first embodiment.

FIG. 11 is a cross-sectional view taken along line XI-XI of FIG. 10, showing an example of a cross-sectional structure in the wall region WR of the semiconductor device 1 according to the first embodiment. As shown in FIG. 11, the semiconductor device 1 includes, for example, contacts 50, 52, 54, 56, 58, and 60, and conductive layers 51, 53, 55, 57, 59, and 61 corresponding to the sealing portions ES1 to ES4, respectively, in the wall region WR. A set of the contacts 50, 52, 54, 56, 58, and 60 and the conductive layers 51, 53, 55, 57, 59, and 61 corresponds to a sealing member.

Structures of the contacts 50, 52, 54, 56, 58, and 60 and the conductive layers 51, 53, 55, 57, 59, and 61 are the same in each sealing portion ES. Specifically, in each sealing portion ES, the conductive layer 51 is provided on the semiconductor substrate 20 via the contact 50. The conductive layer 53 is provided on the conductive layer 51 via the contact 52. The conductive layer 55 is provided on the conductive layer 53 via the contact 54. The conductive layer 57 is provided on the conductive layer 55 via the contact 56. The conductive layer 59 is provided on the conductive layer 57 via the contact 58. The conductive layer 61 is provided on the conductive layer 59 via the contact 60. A plurality of conductive layers 51 are provided at approximately the same height. A plurality of conductive layers 53 are provided at approximately the same height. A plurality of conductive layers 55 are provided at approximately the same height. A plurality of conductive layers 57 are provided in the interconnect layer M0. A plurality of conductive layers 59 are provided in the interconnect layer M1. A plurality of conductive layers 61 are provided in the interconnect layer M2. The number of interconnect layers provided in each sealing portion ES is freely selected.

A set of the contacts 50, 52, 54, and 56 and the conductive layers 51, 53, and 55 in each sealing portion ES divides the insulating layer 33. A set of the contacts 58 and 60 and the conductive layers 57, 59 and 61 in each sealing portion ES divides a part of the insulating layer 34. Each of the contacts 50, 52, 54, 56, 58, and 60 and the conductive layers 51, 53, 55, 57, 59, and 61 is, for example, a metal. In each sealing portion ES, the contacts 50, 52, 54, 56, 58, and 60 and the conductive layers 51, 53, 55, 57, 59, and 61 are electrically coupled. An insulating film may be provided on a side surface of each of the contacts 50, 52, 54, 56, 58, and 60 as a spacer.

The contact 50 of the sealing portion ES1 is, for example, coupled to a P-type impurity diffusion region (p+) provided in the semiconductor substrate 20. The contact 50 of the sealing portion ES2 is, for example, coupled to an n-type impurity diffusion region (n+) provided in the semiconductor substrate 20. The contact 50 of the sealing portion ES3 is, for example, coupled to a P-type impurity diffusion region (p+) provided in the semiconductor substrate 20. The contact 50 of the sealing portion ES4 is, for example, coupled to an n-type impurity diffusion region (n+) provided in the semiconductor substrate 20. A correspondence of each sealing member to an impurity diffusion region is not limited thereto. In the semiconductor device 1, it is preferable that a plurality of sealing portions ES include at least one sealing member coupled to a P-type impurity diffusion region and one sealing member coupled to an N-type impurity diffusion region.

A sealing member of each sealing portion ES is provided in a square ring shape in the top view. Then, the sealing member of each sealing portion ES surrounds the outer periphery of the core region CR in the top view. That is, in an area omitted from the figure, the sealing member of each sealing portion ES has a portion extending in the Y direction and a portion extending in the X direction. Each sealing member can be regarded as a wall between the core region CR and the kerf region KR. If an impurity diffusion region to which the contact 50 of each sealing portion ES is coupled has a sufficient region as a discharge path, the impurity diffusion region may not necessarily be provided in a square ring shape.

Then, in the semiconductor device 1 according to the first embodiment, the sealing member of the sealing portion ES1 provided at the outermost periphery has a void. In this specification, "a component has a void" corresponds to a component, such as a material or a member, being provided in a shape such that a space enclosed by that component is formed. In this example, each of the contacts 50, 52, 54, 56, 58, and 60 of the sealing portion ES1 has a void. These voids preferably surround the core region CR in the top view. The sealing portion ES1 is provided to extend at least from above the semiconductor substrate 20 to the height of the upper end of the insulating layer 33 (a position higher than the upper end of the memory pillar MP). It is preferable that the height of an upper end of a void included in the sealing portion ES1 be higher than the height of the upper end of the memory pillar MP.

Each of the conductive layers 51, 53, 55, 57, 59, and 61 of the sealing portion ES1 may have a void. In the first embodiment, it suffices that any one of the contacts 50, 52, 54, 56, 58, and 60 and the conductive layers 51, 53, 55, 57, 59, and 61, which constitute the sealing member of the sealing portion ES1 has a void. If the sealing member is composed of a conductor including a void, it may be referred to as a conductive member. "A sealing member includes a void" also includes a state of including a void discontinuously provided between the contacts and conductive layers. In the first embodiment, the case in which a sealing member having a void is arranged in the sealing portion ES1 is exemplified, but a sealing member having a void may be arranged in other sealing portions ES.

[1-2] Manufacturing Method

FIG. 12 is a schematic diagram showing an outline of a manufacturing method of the semiconductor device 1 according to the first embodiment. First, an outline of a manufacturing method of the semiconductor device 1 according to the first embodiment will be described with reference to FIG. 12.

First, a wafer is allocated to a lot ("Lot assignment"). The lot may include a plurality of wafers. A front-end process, which includes a combination of an "exposure process" and a "processing process", is then executed.

The exposure process is, for example, a process of irradiating a wafer coated with resist with light transmitted through a photomask so as to transfer a pattern of the photomask onto the wafer. An area where the pattern of the photomask is transferred by a single exposure corresponds to "one shot". A "shot" corresponds to a section area of exposure in the exposure process. In the exposure process, a single shot of exposure is repeatedly executed by shifting the exposure position. That is, the exposure process is executed by a step-and-repeat method.

The processing process is a process of processing (e.g., etching) the wafer by using the resist onto which the pattern is transferred by the exposure process as a mask. Once the processing process is completed, the mask used is removed and the next process is executed.

A wafer for which the front-end process is completed has a plurality of semiconductor devices 1. A dicing process is then executed on the wafer for which the front-end process is completed. The dicing process is a process of separating the wafer into semiconductor device 1 chip units by cutting the wafer based on the shot and the arrangement of the semiconductor devices 1 in the shot. Semiconductor device 1 chips are thus formed. A line that is cut by the dicing process is also called a "dicing line".

FIG. 13 is a plan view showing an example of a detailed chip arrangement in the semiconductor device 1 according to the first embodiment. As shown in FIG. 13, a plurality of semiconductor devices 1 may be formed in an area of one shot on the wafer. An enlarged portion of the wafer illustrates the arrangement of the kerf region KR, wall region WR, and core region CR of each semiconductor device 1. In the dicing process, for example, the wafer is cut along the kerf region KR of each semiconductor device 1.

The wafer for which the front-end process is completed may include both valid and invalid chips. In FIG. 13, a core region CR of a valid chip is shown by thin line hatching and a core region CR of an invalid chip is shown by thick line hatching. In the invalid chip, at least a portion of the wall region WR and core region CR is missing. A semiconductor device 1 with at least the entire wall region WR and core region CR remaining can be used as a valid chip.

Figure 14:
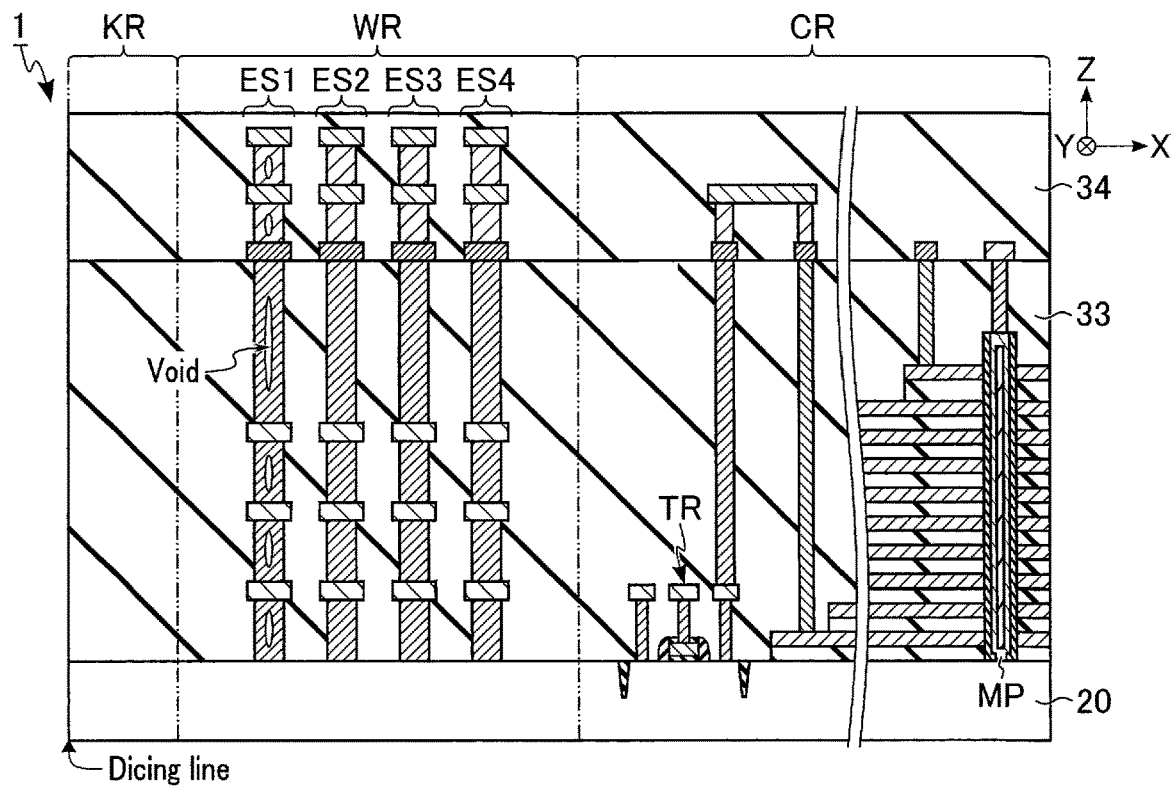
FIG. 14 is a cross-sectional view showing a first example of a cross-sectional structure after dicing in the semiconductor device according to the first embodiment.

FIG. 14 is a cross-sectional view showing a first example of a cross-sectional structure after dicing in the semiconductor device 1 according to the first embodiment, showing a cross section including each of a core region CR, a wall region WR, and a kerf region KR. As shown in FIG. 14, the structure of the semiconductor device 1 in the first example corresponds to a case in which the semiconductor device 1 is separated along the vertical direction in the dicing process. In this way, the dicing line is set to pass through the kerf region KR.

Figure 15:
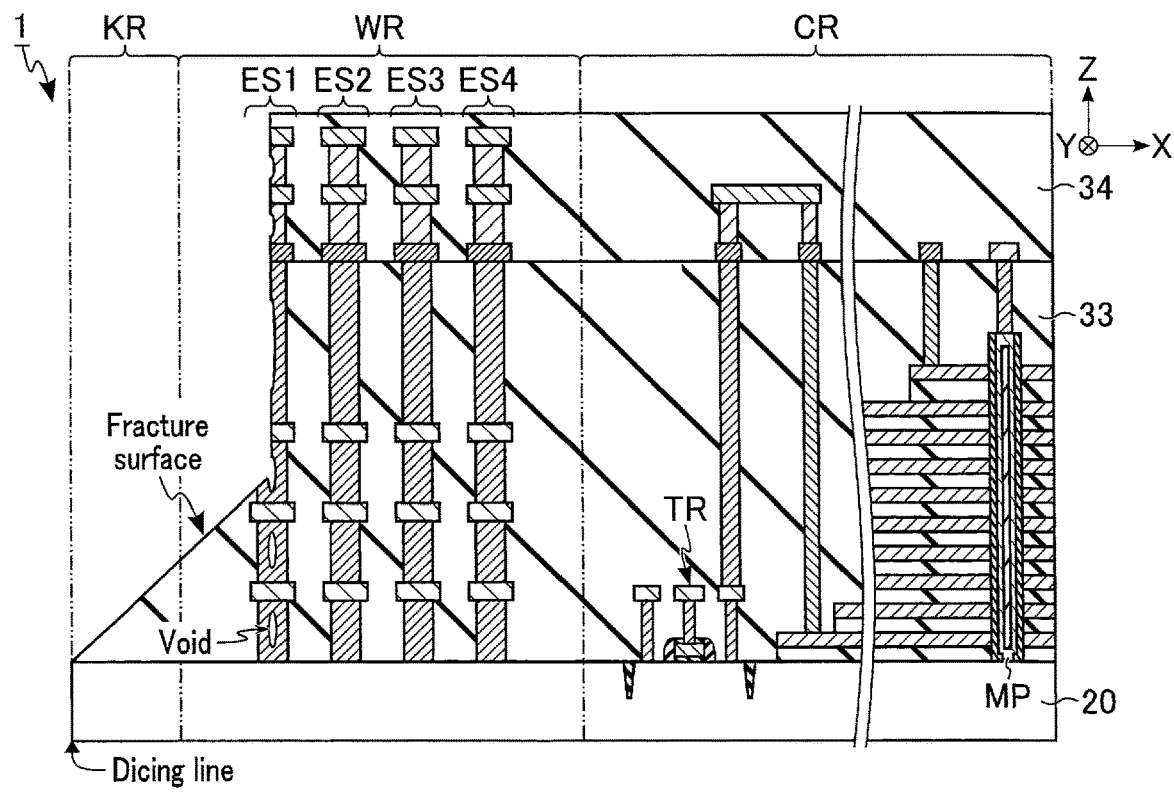
FIG. 15 is a cross-sectional view showing a second example of a cross-sectional structure after dicing in the semiconductor device according to the first embodiment.

FIG. 15 is a cross-sectional view showing a second example of a cross-sectional structure after dicing in the semiconductor device 1 according to the first embodiment, showing a cross section including each of the core region CR, wall region WR, and kerf region KR. As shown in FIG. 15, the structure of the semiconductor device 1 in the second example corresponds to a case in which a crack caused by the dicing process is deflected to the wall region WR side. Thus, even if the dicing line is provided as in the first example, a direction of a fracture surface after the semiconductor device 1 is separated may change due to the progress of the crack caused by the dicing process. In this case, the fracture surface of the chip of the semiconductor device 1 according to the first embodiment may be formed along the positions of the voids that the sealing member of the sealing portion ES1 has.

[1-3] Advantageous Effects of First Embodiment

An advantageous effect of the first embodiment will be described below by using a comparative example.

FIG. 16 is a schematic diagram showing an example of a path of a crack that occurs during dicing for each of the semiconductor device 1 according to the first embodiment and a semiconductor device 1 according to the comparative example. FIGS. 16(A) and 16(B) correspond to the comparative example and the first embodiment, respectively, and each show a cross section including each of the core region CR, wall region WR, and kerf region KR, and a dicing line.

As shown in FIG. 16(A), the semiconductor device 1 according to the comparative example has a configuration in which the sealing portion ES1 is replaced with a sealing portion ES1$z$ with respect to the first embodiment. Similar to the sealing portion ES2, etc., the sealing portion ES1$z$ has a sealing member that has no voids. In the semiconductor device 1 according to the comparative example, if the path (progress) of the crack during dicing is deflected toward the wall region WR side, the crack may reach the core region CR. If the crack reaches the core region CR, the semiconductor device 1 cannot operate properly and can become a defective chip.

On the other hand, as shown in FIG. 16(B), the semiconductor device 1 according to the first embodiment includes a sealing member having a void in the sealing portion ES1. As a crack tip end approaches the void, a stress at the crack tip end interferes with a stress at a void edge, causing the crack tip end to propagate toward the void. Then, when the crack reaches the void, the crack propagates through the void. That is, the void can control a propagating (progressing) direction of the crack.

As a result, the semiconductor device 1 according to the first embodiment can guide the path (propagating direction) of the crack upwardly in the wall region WR by the void in the sealing member of the sealing portion ES1 when the path of the crack during dicing is deflected toward the wall region WR side. The height of the upper end of the void included in the sealing portion ES1 is at least higher than the height of the upper end of the memory pillar MP, thereby suppressing the propagating direction of the crack toward the memory pillar MP side.

Therefore, the semiconductor device 1 according to the first embodiment can suppress the occurrence of chipping in the dicing process and reduce the number of defective chips. That is, the semiconductor device 1 according to the first embodiment can improve the yield of the semiconductor device 1.

[1-4] Modification of First Embodiment

The structure of the sealing portion ES1 described in the first embodiment can be modified in various ways.

Figure 17:
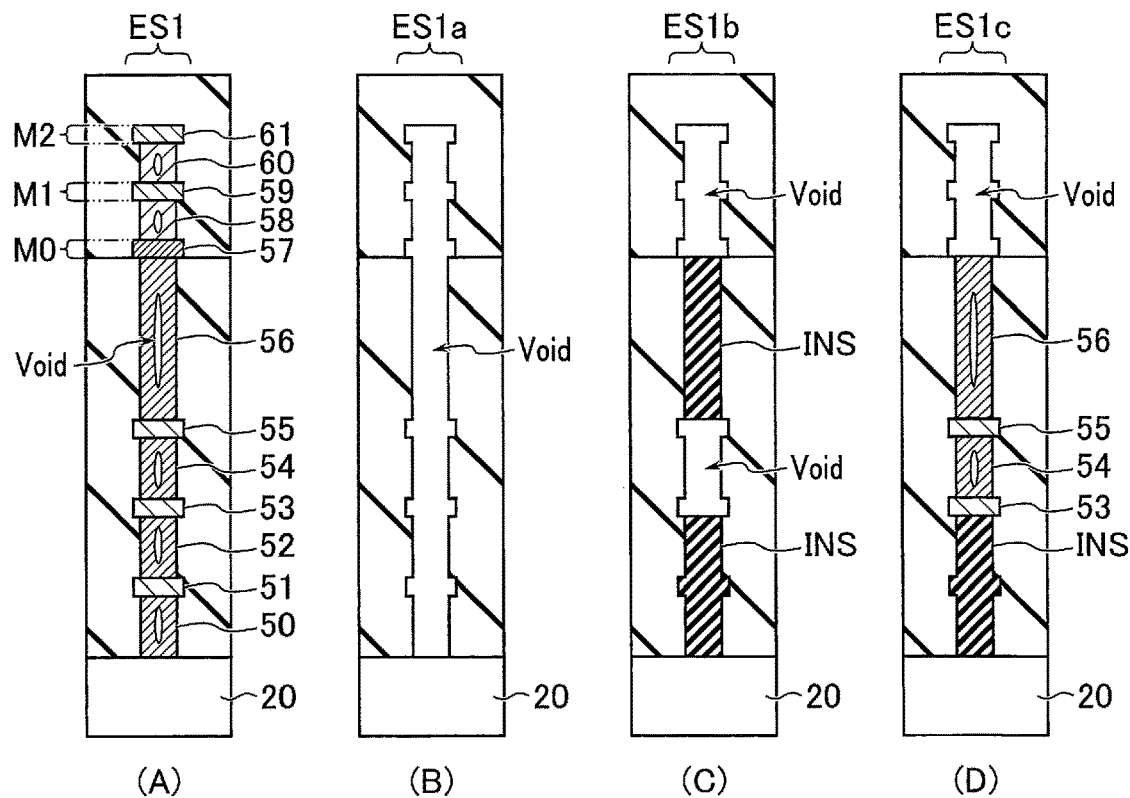
FIG. 17 is a cross-sectional view showing an example of a configuration of a sealing portion in a semiconductor device according to a modification of the first embodiment.

FIG. 17 is a cross-sectional view showing an example of a configuration of the sealing portion ES in the semiconductor device 1 according to a modification of the first embodiment. FIG. 17(A) shows a configuration of the sealing portion ES1 described in the first embodiment. FIGS. 17(B), (C), and (D) show configurations of sealing portions ES1$a$, ES1$b$, and ES1$c$ corresponding to modifications of the sealing portion ES1, respectively. The sealing portions ES1$a$, ES1$b$, and ES1$c$ in the modifications of the first embodiment will be described below in comparison with the sealing portion ES1 described in the first embodiment.

As shown in FIG. 17(B), the sealing portion ES1$a$ has a configuration in which the contacts 50, 52, 54, 56, 58, and 60 and conductive layers 51, 53, 55, 57, 59, and 61 are replaced with voids with respect to the sealing portion ES1. Thus, the sealing portion ES1 may consist only of voids. In other words, the sealing portion ES1a forms a continuous void at least from above the semiconductor substrate 20 to the height of the upper end of the insulating layer 33. Similar to the sealing portion ES1, the sealing portion ES1a can guide a path of a crack and realize the same effect as that of the first embodiment.

As shown in FIG. 17(C), the sealing portion ES1b has a configuration in which the contacts 50, 52, and 56 and conductive layer 51 are replaced with insulators INS and the contacts 54, 58, and 60 and conductive layers 53, 55, 57, 59, and 61 are replaced with voids, with respect to the sealing portion ES1. In this way, the sealing portion ES1 may have a configuration in which a portion composed of a void and a portion composed of an insulator INS are combined. In the sealing portion ES1b, the portion provided with a void and the portion provided with an insulator INS can be changed as appropriate. In other words, the sealing portion ES1b includes a first layer and a second layer aligned in the direction (Z direction) that intersects the surface of the semiconductor substrate 20. The first layer of the sealing portion ES1b is composed of an insulator and the second layer of the sealing portion ES1b is composed of a void. Similar to the sealing portion ES1, the sealing portion ES1b can guide a path of a crack and realize the same effect as that of the first embodiment.

As shown in FIG. 17(D), the sealing portion ES1c has a configuration in which the contacts 50 and 52 and conductive layer 51 are replaced with insulators INS and the contacts 58 and 60 and conductive layers 57, 59, and 61 are replaced with voids, with respect to the sealing portion ES1. In this way, the sealing portion ES1 may have a configuration in which a portion composed of a conductor, a portion composed of a void, and a portion composed of an insulator INS are combined. In the sealing portion ES1c, the portion provided with a conductor, the portion provided with a void, and the portion provided with an insulator INS can be changed as appropriate. In other words, the sealing portion ES1c includes a first layer, a second layer, and a third layer aligned in the direction (Z direction) that intersects the surface of the semiconductor substrate 20. Any one of the first, second, and third layers of the sealing portion ES1c is composed of an insulator. Any one of the first, second, and third layers of the sealing portion ES1c is composed of a void. Any one of the first, second, and third layers of the sealing portion ES1c includes a conductor. The portion composed of a conductor in the sealing portion ES1c may further include a void. Similar to the sealing portion ES1, the sealing portion ES1c can guide a path of a crack and realize the same effect as that of the first embodiment.

A dimension (length in the Z direction) of the void that the sealing member has is not limited. A width of the void in the transverse direction (a direction along the XY plane) is designed to be on the order of 10 nm to 100 nm, for example. A length of the void in the longitudinal direction (a direction along the Z direction) is designed to be on the order of 1 nm to 10 nm, for example. A sealing member having voids has at least one such void. In the sealing member having voids, a plurality of voids may be connected in the Z direction. The sealing portion ES1 is located, for example, within 500 µm from the outer periphery of the chip of the semiconductor device 1.

[2] SECOND EMBODIMENT

A semiconductor device 1 according to a second embodiment has a configuration in which voids are provided in a plurality of sealing portions ES and the sealing portions ES can guide a path of a crack during dicing. Details of the semiconductor device 1 according to the second embodiment will be described below in terms of differences from the first embodiment.

[2-1] Structure of Semiconductor Device 1

Figure 18:
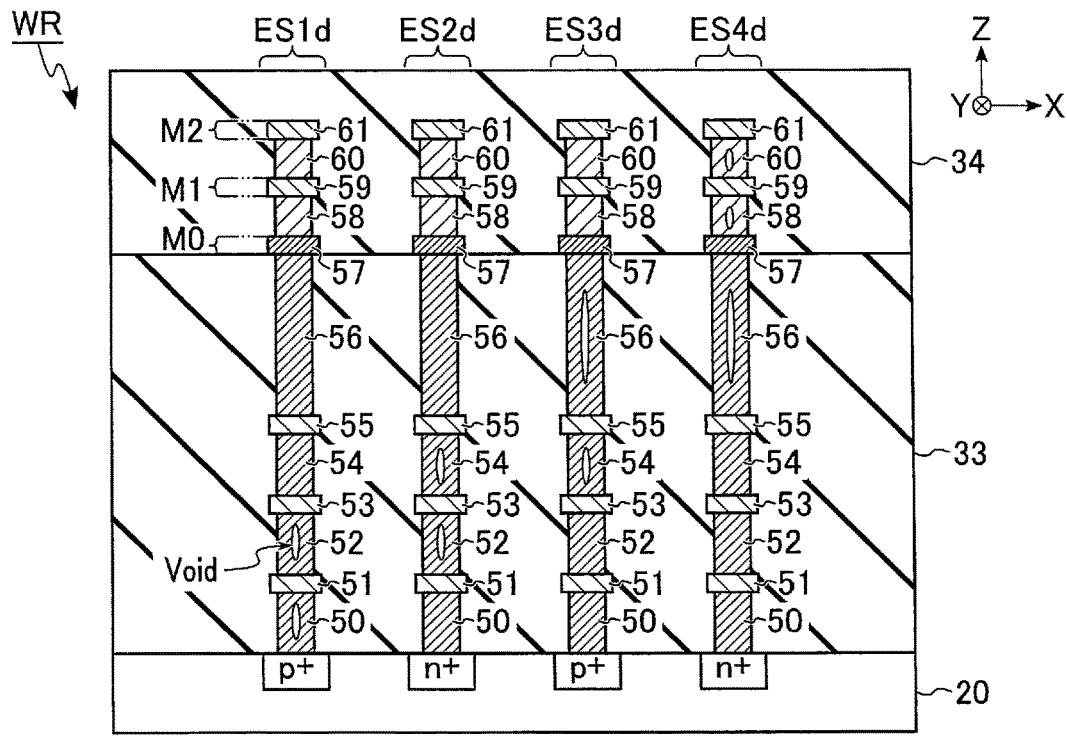
FIG. 18 is a cross-sectional view showing an example of a cross-sectional structure in a wall region of a semiconductor device according to a second embodiment.

FIG. 18 is a cross-sectional view showing an example of a cross-sectional structure in a wall region WR of the semiconductor device 1 according to the second embodiment. As shown in FIG. 18, the semiconductor device 1 according to the second embodiment has a configuration in which the sealing portions ES1, ES2, ES3, and ES4 of the semiconductor device 1 according to the first embodiment are replaced with sealing portions ES1d, ES2d, ES3d, and ES4d, respectively.

In a sealing member of the sealing portion ES1d, the positions of the voids are different with respect to the sealing member of the sealing portion ES1 in the first embodiment. A sealing member of each of the sealing portions ES2d, ES3d, and ES4d has voids. Then, the sealing member of each of the sealing portions ES1d, ES2d, ES3d, and ES4d has a void at a higher position in sequence from an outer periphery of the chip to a central portion of the chip. Specifically, the contacts 50 and 52 of the sealing portion ES1d have voids. The contacts 52 and 54 of the sealing portion ES2d have voids. The contacts 54 and 56 of the sealing portion ES3d have voids. The contacts 56, 58, and 60 of the sealing portion ES4d have voids.

A position of a lower end of a portion provided with the voids in the sealing portion ES1d is lower than a position of a lower end of a portion provided with the voids in the sealing portion ES2d. The position of the lower end of the portion provided with the voids in the sealing portion ES2d is lower than a position of a lower end of a portion provided with the voids in the sealing portion ES3d. The position of the lower end of the portion provided with the voids in the sealing portion ES3d is lower than a position of a lower end of a portion provided with the voids in the sealing portion ES4d.

A position of an upper end of the portion provided with the voids in the sealing portion ES1d is lower than a position of an upper end of the portion provided with the voids in the sealing portion ES2d. The position of the upper end of the portion provided with the voids in the sealing portion ES2d is lower than a position of an upper end of the portion provided with the voids in the sealing portion ES3d. The position of the upper end of the portion provided with the voids in the sealing portion ES3d is lower than a position of an upper end of the portion provided with the voids in the sealing portion ES4d.

A portion between the upper end and the lower end where the voids are provided in the sealing portion ES1d may overlap a portion between the upper end and the lower end where the voids are provided in the sealing portion ES2d in the direction along the XY plane. The portion between the upper end and the lower end where the voids are provided in the sealing portion ES2d may overlap a portion between the upper end and the lower end where the voids are provided in the sealing portion ES3d in the direction along the XY plane. The portion between the upper end and the lower end where the voids are provided in the sealing portion ES3d may overlap a portion between the upper end and the lower end where the voids are provided in the sealing portion ES4d in the direction along the XY plane.

To paraphrase the structures of the sealing portions ES1d to ES4d described above, the sealing portion ES1d is provided to extend at least from above the semiconductor substrate 20 to the height of the upper end of the insulating layer 33, and includes a first conductive member that includes a first void. The sealing portion ES2d is provided to extend at least from above the semiconductor substrate 20 to the height of the upper end of the insulating layer 33, and includes a second conductive member that includes a second void. The sealing portion ES3d is provided to extend at least from above the semiconductor substrate 20 to the height of the upper end of the insulating layer 33, and includes a third conductive member that includes a third void. The sealing portion ES4d is provided to extend at least from above the semiconductor substrate 20 to the height of the upper end of the insulating layer 33, and includes a fourth conductive member that includes a fourth void. The first to fourth voids are arranged so that they are located higher as they become closer to the core region CR.

Each of the sealing portions ES1d, ES2d, ES3d, and ES4d may have a void in any one of the conductive layers 51, 53, 55, 57, 59, and 61. The arrangement of the voids in each of the sealing portions ES1d, ES2d, ES3d, and ES4d can be changed as appropriate. The sealing portion ES1d is located, for example, within 500 μm from the outer periphery of the chip of the semiconductor device 1. A plurality of sealing portions ES1d, ES2d, ES3d, and ES4d are then arranged with an approximately constant spacing. The spacing between adjacent sealing portions ES in the second embodiment is, for example, within a range of 500 nm to 2000 nm. The other configurations of the semiconductor device 1 according to the second embodiment are the same as those in the first embodiment.

[2-2] Advantageous Effect of Second Embodiment

An advantageous effect of the second embodiment will be described below.

Figure 19:
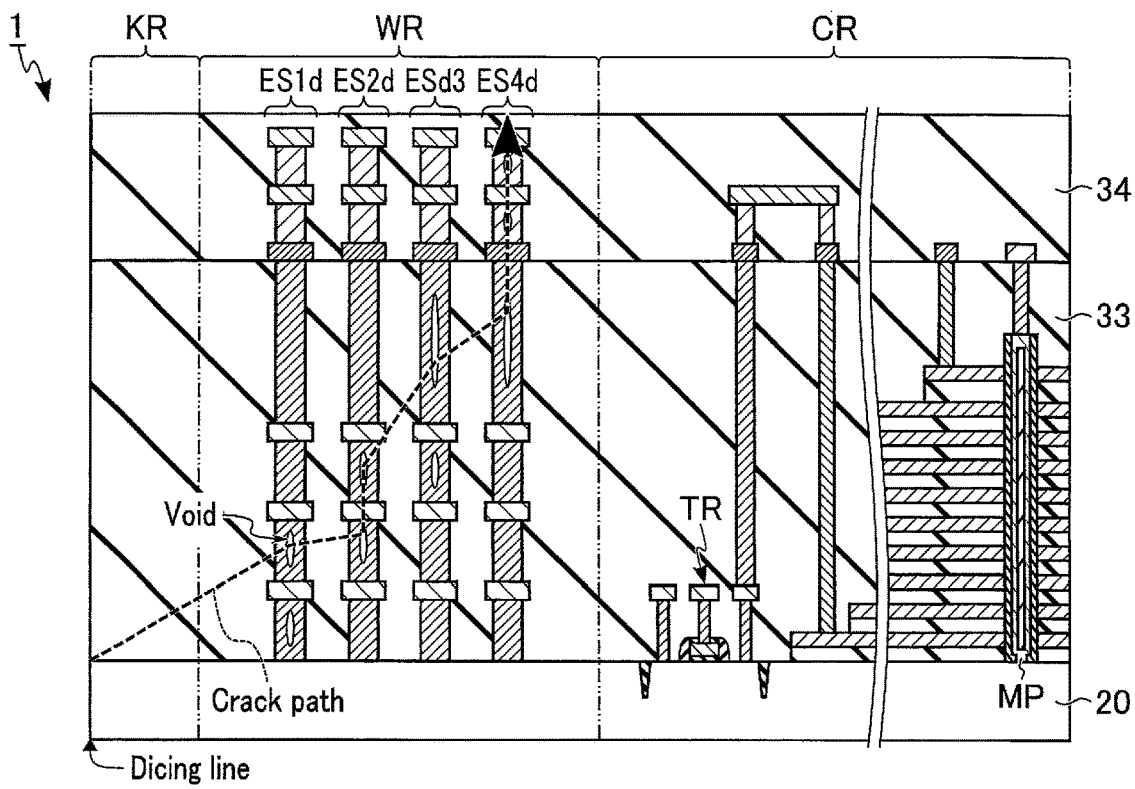
FIG. 19 is a schematic diagram showing an example of a path of a crack that occurs during dicing in the semiconductor device according to the second embodiment.

FIG. 19 is a schematic diagram showing an example of a path of a crack that occurs during dicing in the semiconductor device 1 according to the second embodiment, and shows a cross section including each of the core region CR, wall region WR, and kerf region KR of the semiconductor device 1 according to the second embodiment, and a dicing line. As shown in FIG. 19, the semiconductor device 1 according to the second embodiment includes a plurality of sealing members (sealing portions ES1d to ES4d) provided with voids at different heights.

In the dicing process, when a tip end of the crack reaches a void in the sealing member of the sealing portion ES1d, the tip end of the crack is then guided to a void in the sealing member of the sealing portion ES2d. When the tip end of the crack reaches the void in the sealing member of the sealing portion ES2d, the tip end of the crack is guided upwardly along the voids in the sealing portion ES2d and then to a void in the sealing member of the sealing portion ES3d. When the tip end of the crack reaches the void in the sealing member of the sealing portion ES3d, the tip end of the crack is guided upwardly along the void in the sealing portion ES3d and then to a void in the sealing member of the sealing portion ES4d. When the tip end of the crack reaches the void in the sealing member of the sealing portion ES4d, the tip end of the crack is guided upwardly along the void in the sealing portion ES4d.

As described above, the semiconductor device 1 according to the second embodiment can, when the path of the crack during dicing is deflected to the wall region WR side, guide the path of the crack upwardly in the wall region WR by means of the void in the sealing member of each of the sealing portions ES1d to ES4d. Furthermore, the semiconductor device 1 according to the second embodiment can control the propagating direction of the crack more finely than the first embodiment by designing the position of the void of each of the plurality of sealing portions ES to be located at a higher position from the kerf region KR side toward the core region CR side.

Thereby, the semiconductor device 1 according to the second embodiment can suppress the occurrence of chipping in the dicing process and reduce the number of defective chips. That is, the semiconductor device 1 according to the second embodiment can improve the yield of the semiconductor device 1.

[2-3] Modification of Second Embodiment

The structures of the sealing portions ES1d, ES2d, ES3d, and ES4d described in the second embodiment can be modified in various ways.

Figure 20:
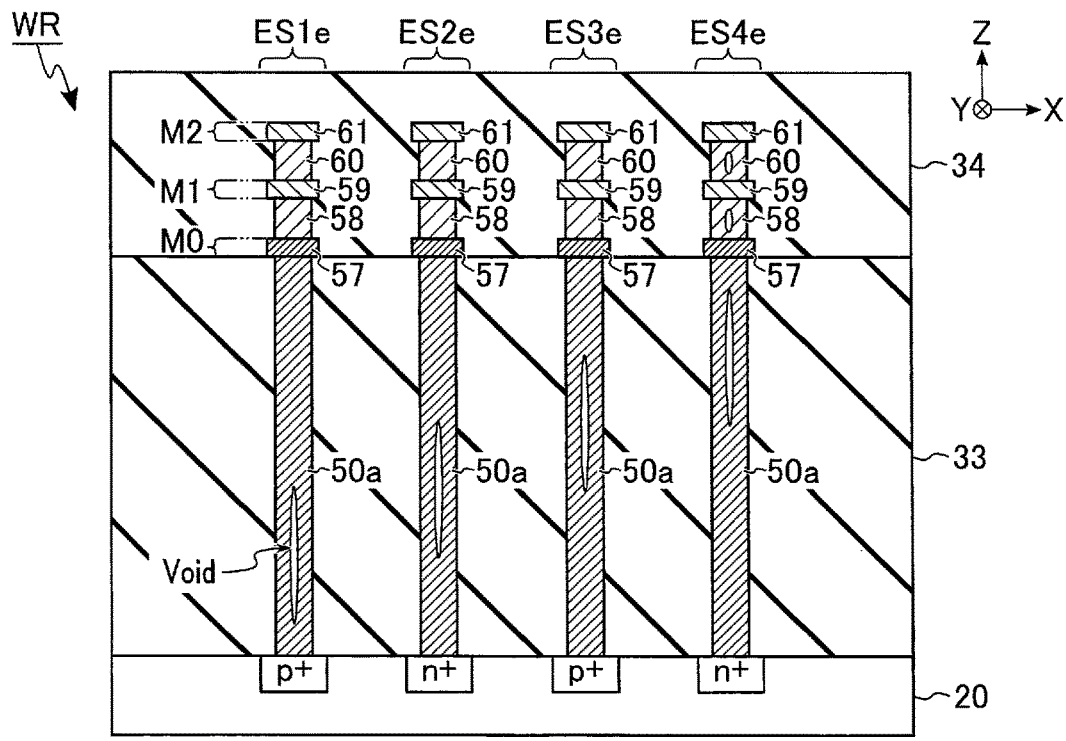
FIG. 20 is a cross-sectional view showing an example of a cross-sectional structure in a wall region of a semiconductor device according to a modification of the second embodiment.

FIG. 20 is a cross-sectional view showing an example of a cross-sectional structure in the wall region WR of the semiconductor device 1 according to a modification of the second embodiment. As shown in FIG. 20, the semiconductor device 1 according to the modification of the second embodiment has a configuration in which the sealing portions ES1d, ES2d, ES3d, and ES4d of the second embodiment are replaced with sealing portions ES1e, ES2e, ES3e, and ES4e.

A sealing member of each of the sealing portions ES1e, ES2e, ES3e, and ES4e has a configuration in which a set of the contacts 50, 52, 54, and 56 and conductive layers 51, 53, and 55 is replaced with a contact 50a. Each contact 50a is provided to extend in the Z direction, and couples the semiconductor substrate 20 and the conductive layer 57. In other words, each contact 50a divides the insulating layer 33.

In the contact 50a of each of the sealing portions ES1e, ES2e, ES3e, and ES4e, a void is formed so as to be located at a higher position from the outer peripheral portion toward the central portion of the semiconductor device 1. Specifically, the contact 50a of the sealing portion ES1e has a void at a position close to the semiconductor substrate 20. The contact 50a of the sealing portion ES2e has a void at a position higher than that of the contact 50a of the sealing portion ES1e. The contact 50a of the sealing portion ES3e has a void at a position higher than that of the contact 50a of the sealing portion ES2e. The contact 50a of the sealing portion ES4e has a void at a position higher than that of the contact 50a of the sealing portion ES3e.

In this way, the position of the void of each of ES1d, ES2d, ES3d, and ES4d described in the second embodiment may be changed inside the contact (or the conductive layer) provided at the same height. Even in such a case, the set of the sealing portions ES1e, ES2e, ES3e, and ES4e can realize the same advantageous effect as that of the second embodiment. The contact 50a of each of the sealing portions ES1e, ES2e, ES3e, and ES4e may be different in width. For example, the width of the contact 50a of each of the sealing portions ES1e, ES2e, ES3e, and ES4e is provided such that the closer the contact is to the core region CR the thicker the width of the contact becomes.

[3] THIRD EMBODIMENT

A third embodiment relates to a forming method of the void provided in the sealing portion ES described in each of the first embodiment and the second embodiment. In the following, as a manufacturing method of a semiconductor device 1 according to the third embodiment, three kinds of forming methods (a first forming method, a second forming method, and a third forming method) of the sealing portion ES will be described.

[3-1] First Forming Method

The first forming method is to form a void in a contact or conductive layer by making a shape of a slit formed in the sealing portion ES by an etching process into a bowing shape.

Figure 21:
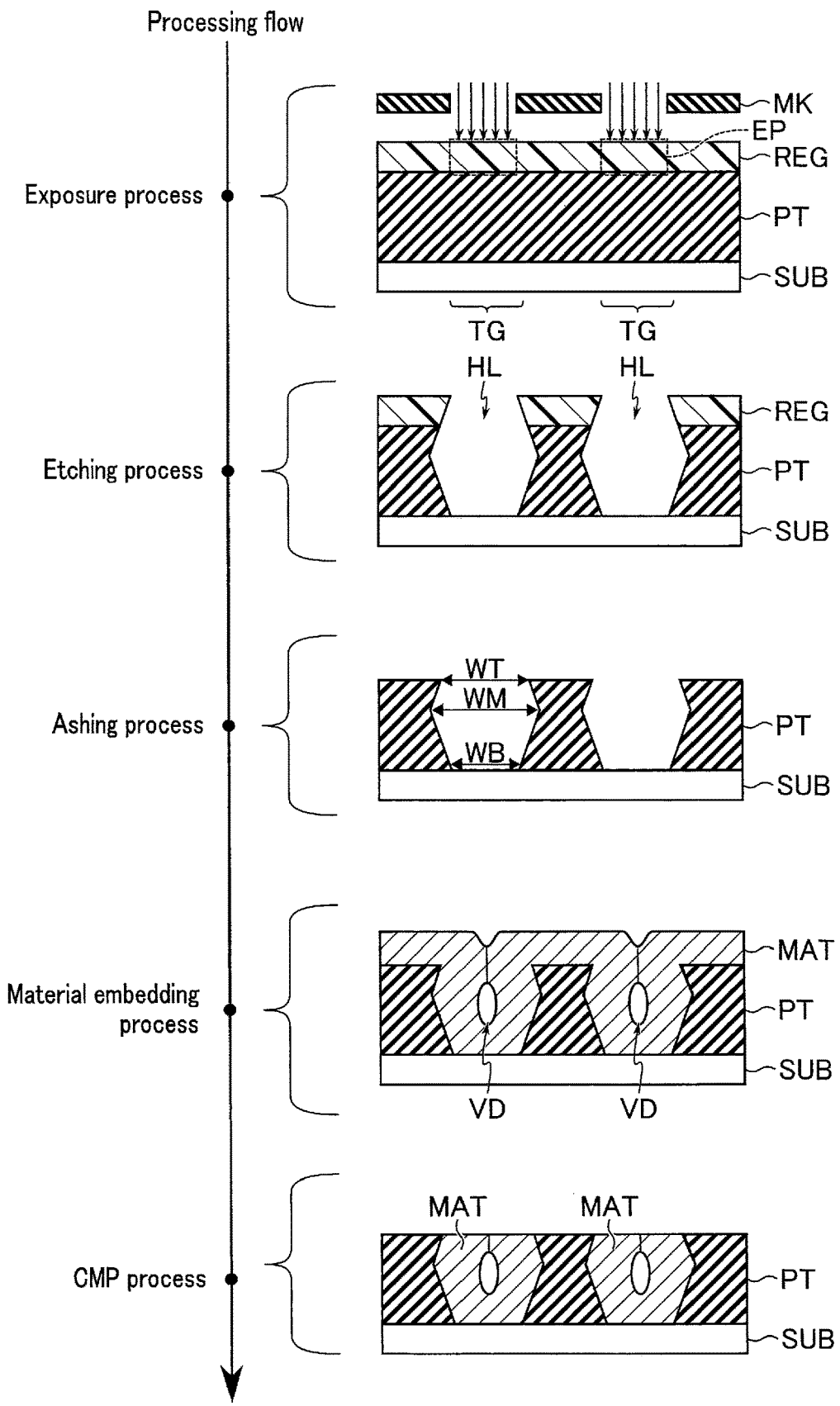
FIG. 21 is a schematic diagram showing an example of a first forming method of a sealing portion in a third embodiment.

FIG. 21 is a schematic diagram showing an example of the first forming method of the sealing portion ES in the third embodiment. FIG. 21 exemplifies a case of processing a member PT on the semiconductor substrate SUB by the first forming method to form a contact or interconnect including a void that can be used for the sealing portion ES. A flow of processing of the first forming method of the sealing portion ES will be described below with reference to FIG. 21.

First, an exposure process is executed using a photomask MK. The photomask MK in the first forming method has, for example, a plurality of openings provided with an equal width. In the exposure process, a resist REG formed on the member PT is exposed via the openings of the photomask MK. An exposed portion EP of the resist REG is removed by a development process after that.

Next, an etching process is executed using the processed resist REG as a mask. The etching process in the first forming method is executed such that a slit HL in a bowing shape is formed in the member PT. As a method of the etching process, for example, RIE (Reactive Ion Etching) is used. Note that the shape of the slit HL may be a tapered shape.

Next, an ashing process is executed, and the resist REG is removed. In the slit HL formed in the member PT processed by the etching process, a width WM of an intermediate portion is wider than each of a width WT of an upper portion and a width WB of a bottom portion. If the slit HL has a tapered shape, the width of the upper portion of the slit HL is formed to be narrower than the width of the lower portion of the slit HL.

Next, a material embedding process is executed, and a material MAT is formed in a manner to fill the slit HL. As a method of the material embedding process, for example, CVD (Chemical Vapor Deposition) is used. The material MAT is, for example, formed along the bowing-shaped slit HL. Thus, the upper portion of the slit HL is occluded before the slit HL is filled, and a void VD is formed at a portion of the slit HL filled with the material MAT. A position of an upper end of the void VD is lower than an upper end of the member PT.

Then, chemical mechanical polishing (CMP) is executed, and the material MAT formed outside the slit HL is removed. It suffices that this process can remove the material MAT outside the slit HL. For example, an etch-back process may be executed instead of the CMP.

Thereby, a structure of a contact or interconnect having the void VD is formed. Specifically, the conductor or contact formed by the first forming method has a first width (WB) at a first height, has a second width (WM) wider than the first width at a second height higher than the first height, and has a third width (WT) narrower than the second width at a third height higher than the second height, along a direction parallel to the surface of the semiconductor substrate 20.

Then, a part of the void VD is included in the second height of the conductor or contact formed in the slit HL.

[3-2] Second Forming Method

The second forming method is to create both a contact or conductive layer having a void and a contact or conductive layer having no void by forming a sealing portion ES in which a slit with a narrow width is arranged and a sealing portion ES in which a slit with a wide width is arranged, in a batch.

Figure 22:
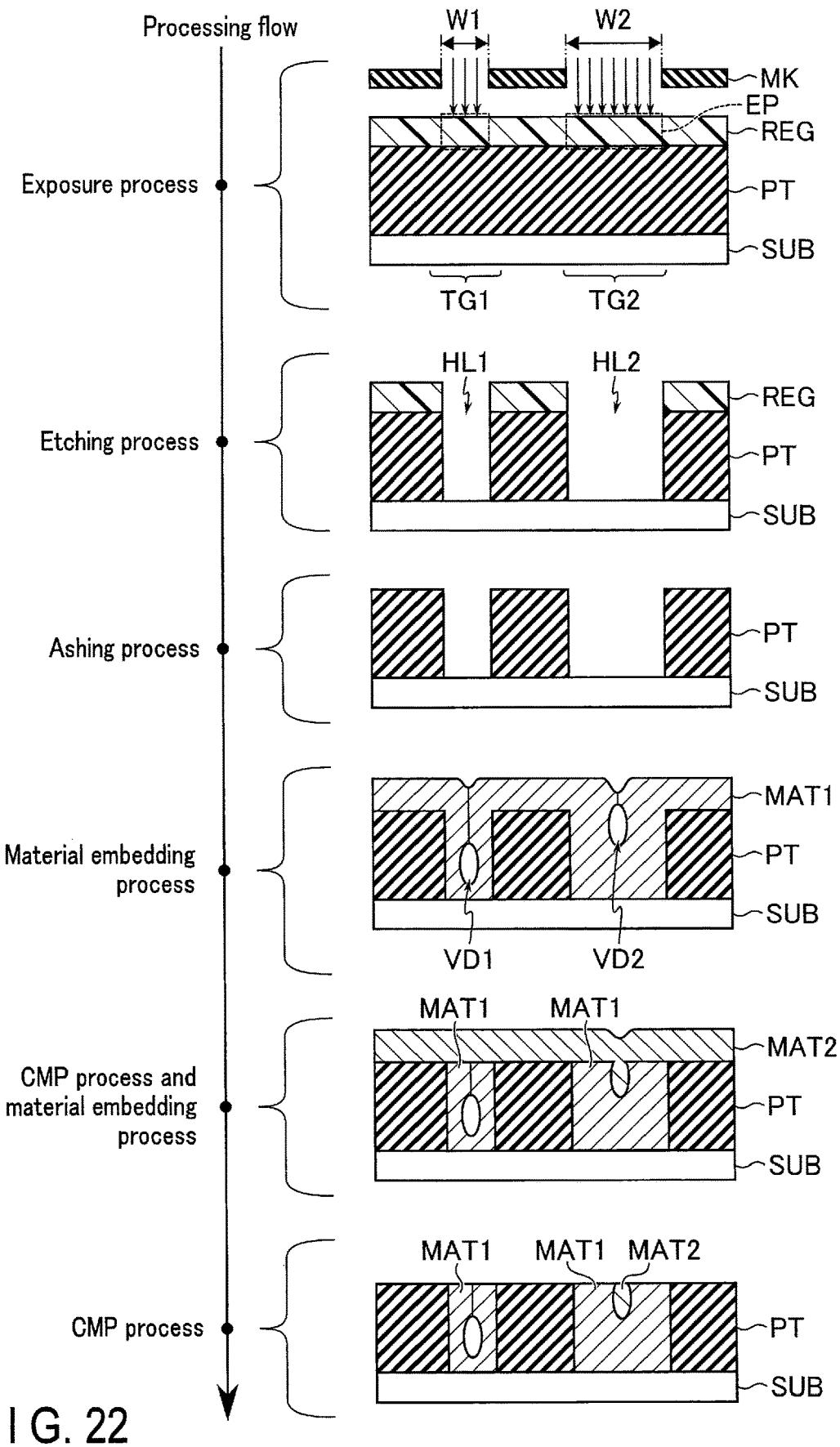
FIG. 22 is a schematic diagram showing an example of a second forming method of the sealing portion in the third embodiment.

FIG. 22 is a schematic diagram showing an example of the second forming method of the sealing portion ES in the third embodiment. FIG. 22 exemplifies a case of processing a member PT on a semiconductor substrate SUB by the second forming method to form a contact or interconnect including a void that can be used for the sealing portion ES. A flow of processing of the second forming method of the sealing portion ES will be described below with reference to FIG. 22.

First, an exposure process is executed using a photomask MK. The photomask MK in the second forming method has an opening provided with a width W1 and an opening provided with a width W2 wider than the width w1. An exposed portion EP of a resist REG is removed by a development process after that.

Next, an etching process is executed using the processed resist REG as a mask. The etching process in the second forming method is executed via the resist REG having the openings with the different widths. Thus, in this process, a slit HL1 with a width corresponding to the width W1 and a slit HL2 with a width corresponding to the width W2 are formed. As a method of the etching process, for example, RIE is used.

Next, an ashing process is executed, and the resist REG is removed. Shapes of the slits HL1 and HL2 formed in the member PT processed by the etching process may be any one of a straight shape, a bowing shape, and a tapered shape.

Next, a material embedding process is executed, and a material MAT1 is formed in a manner to fill the slits HL1 and HL2. As a method of the material embedding process, for example, CVD is used. The material MAT1 is formed along each of the slits HL1 and HL2. Since the width of the slit HL1 is narrower than that of the slit HL2, in the forming process of the material MAT1, an upper portion of the slit HL1 is occluded before an upper portion of the slit HL2 is occluded. Thus, a position of an upper end of a void VD1 formed for the slit HL1 is lower than an upper end of a void VD2 formed for the slit HL2.

Next, a CMP process is executed, and the material MAT1 formed outside the slits HL1 and HL2 is removed. At this time, the material MAT1 of an upper portion of the void VD2 formed by the material MAT1 embedded in the slit HL2 is also removed. In this step, an etch-back process may be executed instead of the CMP. After that, a material embedding process is executed, and the material MAT2 is formed in a manner to fill the void VD2 that is opened at a portion of the slit HL2. The materials MAT1 and MAT2 are, for example, the same material. If there is no problem in characteristics as a sealing member, different materials may be used for the materials MAT1 and MAT2.

The CMP is then executed, and the material MAT2 formed outside the slits HL1 and HL2 is removed. In this step, an etch-back process may be executed instead of the CMP.

Thereby, a structure of the contact or interconnect having the void VD1 and a structure of the contact or interconnect having no void are formed in an interconnect layer at the same height. Specifically, a conductive layer or contact including the void VD1 surrounded by the material MAT1 is formed in the slit HL1. In the slit HL2, a conductive layer or contact formed by the materials MAT1 and MAT2 is formed. In a direction parallel to the surface of the semiconductor substrate 20, a width of the conductive layer or contact formed in the slit HL2 is wider than that of the conductive layer or contact formed in the slit HL1. Further, the slit HL2 includes the material MAT2 provided in a manner such that a height of an upper end of the material MAT2 is aligned with that of an upper end of each of the material MAT1 in the slit HL1 and the material MAT1 in the slit HL2, on the material MAT1.

[3-3] Third Forming Method

The third forming method is to form a void at a height according to a width of a slit formed in the sealing portion ES by an etching process by adjusting the width of the slit.

FIG. 23 is a schematic diagram showing an example of the third forming method of the sealing portion ES in the third embodiment. FIG. 23 exemplifies a case of processing a member PT on a semiconductor substrate SUB by the third forming method to form a contact or interconnect including a void that can be used for the sealing portion ES. A flow of processing of the third forming method of the sealing portion ES will be described below with reference to FIG. 23.

First, an exposure process is executed using a photomask MK. The photomask MK in the third forming method has an opening provided with a width W1 and an opening provided with a width W3 wider than the width W1 and narrower than the width W2 in the second forming method. An exposed portion EP of a resist REG is removed by a development process after that.

Next, an etching process is executed using the processed resist REG as a mask. The etching process in the third forming method is executed via the resist REG having the openings with the different widths. Thus, in this step, a slit HL1 with a width corresponding to the width W1 and a slit HL3 with a width corresponding to the width W3 are formed. As a method of the etching process, for example, RIE is used.

Next, an ashing process is executed, and the resist REG is removed. Shapes of the slits HL formed in the member PT processed by the etching process may be any one of a straight shape, a bowing shape, and a tapered shape.

Next, a material embedding process is executed, and a material MAT is formed in a manner to fill the slits HL1 and HL3. As a method of the material embedding process, for example, CVD is used. The material MAT is formed along each of the slits HL1 and HL3. Since the width of the slit HL1 is narrower than that of the slit HL3, in the forming process of the material MAT, an upper portion of the slit HL1 is occluded before an upper portion of the slit HL3 is occluded. Thus, a position of an upper end of a void VD1 formed for the slit HL1 is lower than an upper end of a void VD3 formed for the slit HL3. Further, in the third forming method, a position of the upper end of the void VD3 is provided to be lower than an upper end of the member PT.

CMP is then executed, and the material MAT formed outside the slits HL1 and HL3 is removed. In this step, an etch-back process may be executed instead of the CMP.

Thereby, a structure of a plurality of contacts or interconnects having the voids VD1 and VD3 with different heights is formed. Specifically, in a direction parallel to the surface of the semiconductor substrate SUB, a width of an upper end of the contact or interconnect formed in the slit HL1 is narrower than that of an upper end of the contact or interconnect formed in the slit HL3. Then, the height of the void VD3 surrounded by the contact or conductive layer in the slit HL3 is higher than that of the void VD1 surrounded by the contact or conductive layer in the slit HL1.

[4] FOURTH EMBODIMENT

A semiconductor device 1 according to a fourth embodiment has a configuration in which peripheral circuits are arranged under a memory cell array 10 and a sealing portion ES including a void is provided. Details of the semiconductor device 1 according to the fourth embodiment will be described below in terms of differences from the first to third embodiments.

[4-1] Structure of Semiconductor Device 1

(Cross-Sectional Structure in Core Region CR of Semiconductor Device 1)

FIG. 24 is a cross-sectional view showing an example of a cross-sectional structure in a core region CR of the semiconductor device 1 according to the fourth embodiment. As shown in FIG. 24, the semiconductor device 1 according to the fourth embodiment has a structure in which the peripheral circuits (e.g., a transistor TR) are provided under the memory cell array 10 (a memory area MA and a hookup area HA) in the core region CR.

Specifically, an insulating layer 35 is provided on a semiconductor substrate 20. The insulating layer 35 includes circuit elements corresponding to the row decoder module 15, the sense amplifier module 16, etc.

Specifically, the insulating layer 35 includes conductive layers GC and 71 to 73 and contacts CS and C0 to C2. The conductive layer GC is provided on the semiconductor substrate 20 with a gate insulating film interposed therebetween. The conductive layer GC, for example, functions as a gate electrode of the transistor TR. The contact co is provided on the conductive layer GC. Two contacts CS are respectively coupled to a source region and a drain region of the transistor TR provided in the semiconductor substrate 20. The conductive layer 71 is provided on each of the contacts CS and C0. The contact C1 is provided on the conductive layer 71. The conductive layer 72 is provided on the contact C1. The contact C2 is provided on the conductive layer 72. The conductive layer 73 is provided on the contact C2. Hereinafter, interconnect layers provided with the conductive layers 71, 72, and 73 will be referred to as "D0", "D1", and "D2", respectively.

An insulating layer 36 is provided on the insulating layer 35. The insulating layer 36 contains, for example, a silicon nitride. The insulating layer 36 may, for example, prevent hydrogen, which is generated in a thermal step for forming the stacked interconnects of the memory cell array 10, from entering the transistor TR provided on the semiconductor substrate 20. The insulating layer 36 may be referred to as a "barrier film".

A semiconductor layer 70 is provided on the insulating layer 36, with an insulating layer 37 interposed therebetween. The semiconductor layer 70 is, for example, formed in a plate shape expanding along the XY plane, and is used as a source line SL. The conductive layer 70 contains, for example, phosphorus-doped silicon. On the semiconductor layer 70, for example, a stacked interconnect structure of conductive layers 21 to 23 is provided and a memory pillar MP penetrating the conductive layers 21 to 23 is provided in the memory area MA, in the same manner as in the first embodiment. A semiconductor layer 41 of the memory pillar MP is in contact with the semiconductor layer 70.

Further, an end portion of each of the stacked interconnects has a terraced portion similar to the first embodiment in the hookup area HA. Then, a contact CC is coupled to each terraced portion from above (i.e., from the insulating layer 34 side). The stacked interconnects are covered with an insulating layer 33. A part of the insulating layer 33 of the fourth embodiment is in contact with the insulating layer 37. Similar to the first embodiment, an insulating layer 34 including conductive layers 24, 27, 28, and 29, a contact V0, etc. is provided on the insulating layer 33.

In the fourth embodiment, a contact C3 is provided on the conductive layer 73. The contact C3 of the fourth embodiment penetrates the insulating layers 33, 37, and 36 and a part of the insulating layer 35. A top surface of the contact C3 of the fourth embodiment is in contact with a conductive layer 29 in the same manner as in the first embodiment. Thereby, the conductive layer 21 corresponding to a select gate line SGS is electrically coupled to the transistor TR via the contacts CS, C1 to C3, CC, and V0 and the conductive layers 27 to 29 and 71 to 73. In brief, the conductive layer 21 is electrically coupled to the transistor TR provided under the memory cell array 10 via the contact CC coupled to the conductive layer 21 from above. Similarly, each of the conductive layers 22 and 23 included in the stacked interconnects is coupled to the transistor provided under the memory cell array 10 via the contact CC, the conductive layer 27, etc., coupled from above the conductive layers 22 and 23.

Cross-Sectional Structure in Wall Region WR of Semiconductor Device 1

Figure 25:
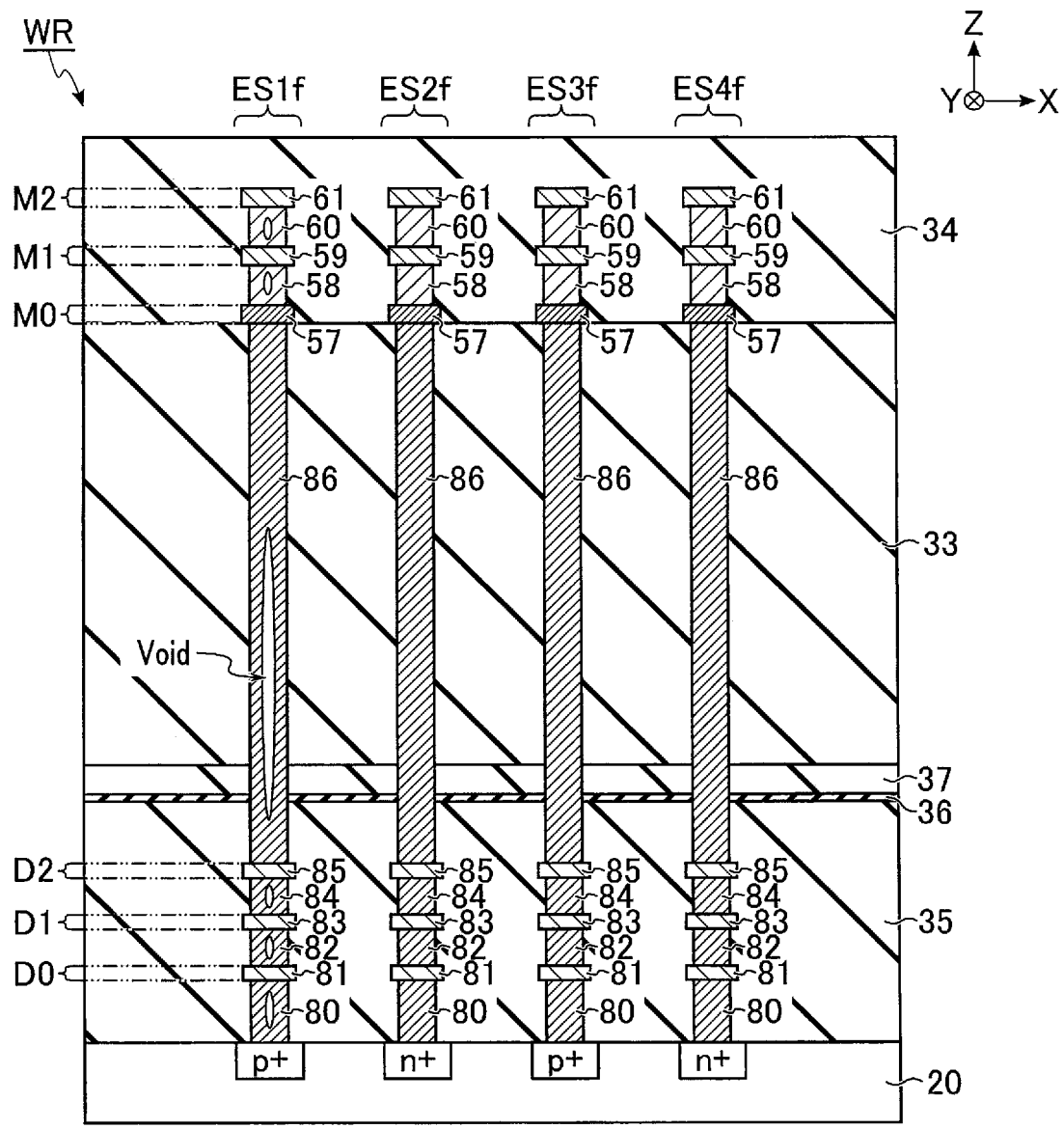
FIG. 25 is a cross-sectional view showing an example of a cross-sectional structure in a wall region of the semiconductor device according to the fourth embodiment.

FIG. 25 is a cross-sectional view showing an example of a cross-sectional structure in a wall region WR of the semiconductor device 1 according to the fourth embodiment. As shown in FIG. 25, the semiconductor device 1 according to the fourth embodiment has a configuration in which the sealing portions ES1, ES2, ES3, and ES4 of the semiconductor device 1 according to the first embodiment are replaced with sealing portions ES1$f$, ES2$f$, ES3$f$, and ES4$f$, respectively. A sealing member of the sealing portion ES1$f$ has a configuration in which a set of the contacts 50, 52, 54, and 56 and conductive layers 51, 53, and 55 is replaced with a set of contacts 80, 82, 84, and 86 and conductive layers 81, 83, and 85 with respect to the sealing member of the sealing portion ES1 in the first embodiment.

Structures of the contacts 80, 82, 84, and 86 and the conductive layers 81, 83, and 85 in each of the sealing portions ES1$f$, ES2$f$, ES3$f$, and ES4$f$ are similar. Specifically, in each of the sealing portions ES1$f$, ES2$f$, ES3$f$, and ES4$f$, the conductive layer 81 is provided on the semiconductor substrate 20 via the contact 80. The conductive layer 83 is provided on the conductive layer 81 via the contact 82. The conductive layer 85 is provided on the conductive layer 83 via the contact 84. A conductive layer 57 is provided on the conductive layer 85 via the contact 86. A plurality of conductive layers 81 are provided in the interconnect layer D0. A plurality of conductive layers 83 are provided in the interconnect layer D1. A plurality of conductive layers 85 are provided in the interconnect layer D2.

The set of the contacts 80, 82, 84, and 86 and conductive layers 81, 83, and 85 of each of the sealing portions ES1$f$, ES2$f$, ES3$f$, and ES4$f$ divides the insulating layers 35, 36, 37, and 33. Each of the contacts 80, 82, 84, and 86 and the conductive layers 81, 83, and 85 is, for example, a metal. In each of the sealing portions ES1$f$, ES2$f$, ES3$f$, and ES4$f$, the contacts 80, 82, 84, 86, 58, and 60 and the conductive layers 81, 83, 85, 57, 59, and 61 are electrically coupled. An insulating film may be provided on a side surface of each of the contacts 80, 82, 84, and 86 as a spacer.

The contact 80 of the sealing portion ES1$f$ is, for example, coupled to a P-type impurity diffusion region (p+) provided in the semiconductor substrate 20. The contact 80 of the sealing portion ES2$f$ is, for example, coupled to an n-type impurity diffusion region (n+) provided in the semiconductor substrate 20. The contact 80 of the sealing portion ES3$f$ is, for example, coupled to a P-type impurity diffusion region (p+) provided in the semiconductor substrate 20. The contact 50 of the sealing portion ES4$f$ is, for example, coupled to an n-type impurity diffusion region (n+) provided in the semiconductor substrate 20. A correspondence of each sealing member to an impurity diffusion region is not limited thereto. In the semiconductor device 1 according to the fourth embodiment, it is preferable that a plurality of sealing portions ES include at least one sealing member coupled to an N-type impurity diffusion region and one sealing member coupled to a P-type impurity diffusion region.

The sealing member of each of the sealing portions ES1$f$, ES2$f$, ES3$f$, and ES4$f$ is provided in a square ring shape in the top view. Then, the sealing member of each of the sealing portions ES1$f$, ES2$f$, ES3$f$, and ES4$f$ surrounds the core region CR in the top view. That is, in an area omitted from the figure, the sealing member of each of the sealing portions ES1$f$, ES2$f$, ES3$f$, and ES4$f$ has a portion extending in the Y direction and a portion extending in the X direction. The sealing member of each of the sealing portions ES1$f$, ES2$f$, ES3$f$, and ES4$f$ can be regarded as a wall between the core region CR and the kerf region KR. If a diffusion region to which the contact 80 of the sealing member of each of the sealing portions ES1$f$, ES2$f$, ES3$f$, and ES4$f$ is coupled has a sufficient region as a discharge path, the diffusion region may not necessarily be provided in a square ring shape.

In the semiconductor device 1 according to the fourth embodiment, the sealing member of the sealing portion ES1$f$ provided at the outermost periphery has a void in the same manner as in the first embodiment. In this example, each of the contacts 80, 82, 84, 86, 58, and 60 of the sealing portion ES1$f$ has a void. These voids preferably surround the core region CR in the top view.

Each of the conductive layers 81, 83, 85, 57, 59, and 61 of the sealing portion ES1$f$ may have a void. In the fourth embodiment, it suffices that any one of the contacts 80, 82, 84, 86, 58, and 60 and the conductive layers 81, 83, 85, 57, 59, and 61, which constitute the sealing member of the sealing portion ES1$f$, has a void. Further, in the fourth embodiment, the case in which a sealing member having a void is arranged in the sealing portion ES1$f$ is exemplified, but a sealing member having a void may be arranged in other sealing portions ES. The other configurations of the semiconductor device 1 according to the fourth embodiment are the same as those in the first embodiment.

[4-2] Advantageous Effects of Fourth Embodiment

Similar to the first embodiment, the semiconductor device 1 according to the fourth embodiment can, when a path of a crack during dicing is deflected to the wall region WR side, guide the path (propagating direction) of the crack upwardly in the wall region WR by means of the void in the sealing member of the sealing portion ES1$f$. Therefore, the semiconductor device 1 according to the fourth embodiment can suppress the occurrence of chipping in the dicing process and reduce the number of defective chips. That is, the semiconductor device 1 according to the fourth embodiment can improve the yield of the semiconductor device 1 in the same manner as in the first embodiment.

The fourth embodiment corresponds to a combination of the semiconductor device 1 having the peripheral circuits under the memory cell array 10 and the sealing portion ES1*f* having a structure similar to that of the sealing portion ES1 of the first embodiment. The configuration is not limited thereto, and the semiconductor device 1 having the peripheral circuits under the memory cell array 10 may be combined with any one of the modification of the first embodiment, the second embodiment, the modification of the second embodiment, and the third embodiment. In the semiconductor device 1 according to the fourth embodiment, the sealing members of the plurality of sealing portions ES may have voids, and the design of the sealing portions ES may be changed as appropriate based on the contents of the modification of the first embodiment, the second embodiment, the modification of the second embodiment, and the third embodiment.

[5] FIFTH EMBODIMENT

A semiconductor device 1 according to a fifth embodiment has a chip-bonded structure in which a chip including a memory cell array 10 and a chip including peripheral circuits that are formed by using different wafers are bonded, and has a configuration in which a sealing portion ES including a void is provided. Details of the semiconductor device 1 according to the fifth embodiment will be described below in terms of differences from the first to fourth embodiments.

[5-1] Outline of Manufacturing Method of Semiconductor Device 1

FIG. 26 is a schematic diagram showing an outline of a manufacturing method of the semiconductor device 1 according to the fifth embodiment. The outline of the manufacturing method of the semiconductor device 1 according to the fifth embodiment will be described below with reference to FIG. 26. Hereinafter, a process of bonding two wafers will be referred to as a "bonding process". A device that executes a bonding process will be referred to as a "bonding apparatus". During the bonding process, a wafer arranged on an upper side will be referred to as an "upper wafer UW". During the bonding process, a wafer arranged on a lower side will be referred to as a "lower wafer LW". The two bonded wafers, i.e., a pair of an upper wafer UW and a lower wafer LW, will be referred to as a "bonded wafer BW".

First, a lot including an upper wafer UW and a lot including a lower wafer LW are prepared ("Lot assignment"). Then, a front-end process ("Exposure process", "Etching process", etc.) is executed on each of the lot including the upper wafer UW and the lot including the lower wafer LW, and a semiconductor circuit is formed on the upper wafer UW and the lower wafer LW. An arrangement of a plurality of shots on the upper wafer UW and an arrangement of a plurality of shots on the lower wafer LW are set to be identical.

After the front-end process of each of the upper wafer UW and the lower wafer LW is completed, a bonding process is executed. Specifically, a bonding apparatus arranges a front surface of the upper wafer UW and a front surface of the lower wafer LW face to face. Then, the bonding apparatus adjusts (aligns) an overlapping position of a pattern formed on the front surface of the upper wafer UW and a pattern formed on the front surface of the lower wafer LW, and bonds the front surfaces of the upper wafer UW and the lower wafer LW together. A bonded wafer BW is thereby formed. A thermal process may be executed after the front surfaces of the upper wafer UW and the lower wafer LW are bonded together.

After that, a wiring step is executed for the bonded wafer BW. The wiring step includes a step of removing a substrate of the upper wafer UW, a step of forming a contact for an interconnect provided on a back surface side of the upper wafer UW, a step of forming a pad used for coupling between the semiconductor device 1 and the memory controller 2, a step of forming a pad for supplying the semiconductor device 1 with power, etc. After the wiring step is completed, the bonded wafer BW is separated into chip units by a dicing process in the same manner as in the first embodiment. Thereby, the semiconductor device 1 having a chip-bonded structure is formed.

In the semiconductor device 1 according to the fifth embodiment, for example, the memory cell array 10 is formed on the upper wafer UW, and a command register 11, an address register 12, a sequencer 13, a driver module 14, a row decoder module 15, a sense amplifier module 16, etc. are formed on the lower wafer LW. Hereinafter, a chip including the memory cell array 10 will also be referred to as a "memory chip". A chip including peripheral circuits for controlling the memory cell array 10 will also be referred to as a "CMOS chip".

[5-2] Structure of Semiconductor Device 1

(Chip-Bonded Structure of Semiconductor Device 1)

FIG. 27 is a perspective view showing an example of the chip-bonded structure of the semiconductor device 1 according to the fifth embodiment. FIG. 27 schematically shows a structure of each of the upper wafer UW and the lower wafer LW in the bonding process. As shown in FIG. 27, in this example, the upper wafer UW corresponds to a memory chip, and the lower wafer LW corresponds to a CMOS chip.

An upper surface S1 and a lower surface S2 of the upper wafer UW correspond to the back surface and the front surface of the upper wafer UW, respectively. An upper surface S3 and a lower surface S4 of the lower wafer LW correspond to the front surface and a back surface of the lower wafer LW, respectively. A "front surface of a wafer" corresponds to a surface out of the two opposing surfaces of the wafer that is on a side on which the semiconductor circuit is formed. A "back surface of a wafer" corresponds to a surface opposite to the front surface of the wafer out of the two opposing surfaces of the wafer. In the bonding process of the manufacturing step of the semiconductor device 1, the lower surface S2 of the upper wafer UW and the upper surface S3 of the lower wafer LW are bonded together.

The upper wafer UW has a set of a core region CR_U, a wall region WR_U, and a kerf region KR_U corresponding to the memory chip. The lower wafer LW has a set of a core region CR_L, a wall region WR_L, and a kerf region KR_L corresponding to the CMOS chip. The core region CR_U, wall region WR_U, and kerf region KR_U of the upper wafer UW can be arranged to face the core region CR_L, wall region WR_L, and kerf region KR_L of the lower wafer LW, respectively.

On the lower surface S2 of the upper wafer UW, a plurality of bonding pads BP_U and a plurality of sealing portions ES_U are exposed. The bonding pads BP_U are arranged in the core region CR_U. The sealing portions ES_U are arranged in the wall region WR_U.

On the upper surface S3 of the lower wafer LW, a plurality of bonding pads BP_L and a plurality of sealing portions ES_L are exposed. The bonding pads BP_L are arranged in the core region CR_L. The sealing portions ES_L are arranged in the wall region WR_L.

The bonding pads BP_U of the upper wafer UW can be arranged to face the bonding pads BP_L of the lower wafer LW, respectively. That is, the bonding pads BP_U are associated with the bonding pads BP_L, respectively. Pairs of corresponding bonding pads BP_U and BP_L are bonded by the bonding process. As a result, the circuits in the memory chip and the circuits in the CMOS chip are electrically coupled via the pairs of the bonding pads BP_U and BP_L. Specifically, for example, the memory cell array 10 provided on the upper wafer UW and the row decoder module 15, etc. provided on the lower wafer LW are electrically coupled via the pairs of the bonding pads BP_U and BP_L.

The sealing portions ES_U of the upper wafer UW can be arranged to face the sealing portions ES_L of the lower wafer LW, respectively. That is, the sealing portions ES_U correspond to the sealing portions ES_L, respectively. The pairs of corresponding sealing portions ES_U and ES_L are bonded by the bonding process. The pairs of the sealing portions ES_U provided on the upper wafer UW and the sealing portions ES_L provided on the lower wafer LW are electrically coupled via pairs of conductors similar to the bonding pads BP_U and BP_L.

(Cross-Sectional Structure in Core Region CR of Semiconductor Device 1)

FIG. 28 is a cross-sectional view showing an example of a cross-sectional structure in the core region CR of the semiconductor device 1 according to the fifth embodiment. As shown in FIG. 28, the semiconductor device 1 according to the fifth embodiment has in the core region CR_L a structure similar to that under the insulating layer 36 of the semiconductor device 1 according to the fourth embodiment, and has in the core region CR_U a structure similar to the structure above the insulating layer 36 of the semiconductor device 1 according to the fourth embodiment that is vertically inverted. That is, in the fifth embodiment, each terraced portion of the stacked interconnects in the hookup area HA is arranged to face the semiconductor substrate 20. The semiconductor device 1 according to the fifth embodiment then further includes insulating layers 90 to 92 and conductive layers 93 and 94.

The insulating layers 90 and 91 are provided at a boundary portion of the core regions CR_U and CR_L. Specifically, the insulating layers 35, 90, 91, 34, and 33 are provided in this order on the semiconductor substrate 20. The insulating layer 90 is exposed on the upper surface S3 of the lower wafer LW (semiconductor substrate 20) during the bonding process. Hereinafter, an interconnect layer provided with the insulating layer 90 will be referred to as "D3". The insulating layer 91 is exposed on the lower surface S2 of the upper wafer UW during the bonding process. The insulating layer 91 is, for example, included in the interconnect layer M2. The insulating layers 90 and 91 come into contact with each other by the bonding process.

An insulating layer 92 is, for example, a layer formed in the wiring step after the bonding process. The insulating layer 92 is provided on the semiconductor layer 70. In the fifth embodiment, a contact provided through the insulating layer 92 may be coupled to the semiconductor layer 70. That is, the source line SL may be coupled to the circuits on the semiconductor substrate 20 via a portion above the insulating layer 92. Above the insulating layer 92, in an area omitted from the figure, a pad used for coupling with the memory controller 2, a contact penetrating the core region CR_U, etc. are provided.

The conductive layers 93 and 94 are used as bonding pads BP_L to BP_U, respectively. The conductive layer 93 is provided on the conductive layer 73 via the contact C3. The conductive layer 93 is provided to penetrate the insulating layer 90, and is included in the interconnect layer D3. The conductive layer 94 is provided on the conductive layer 93. The conductive layer 94 is provided to penetrate the insulating layer 91, and is included in the interconnect layer M2. The conductive layers 93 and 94 each contain, for example, copper.

In the fifth embodiment, the conductive layer 28 is provided on the conductive layer 94 via a contact V1. The conductive layer 27 is provided on the conductive layer 28 via the contact V0. The conductive layer 21 is provided on the conductive layer 27 via the contact CC. That is, the contact CC is coupled to each terraced portion of the stacked interconnects from below (i.e., from the semiconductor substrate 20 side). Thereby, the conductive layer 21 corresponding to the select gate line SGS is electrically coupled to the transistor TR via the contacts CS, C1 to C3, CC, V0, and V1 and the conductive layers 27, 28, 71 to 73, 93, and 94. In brief, the conductive layer 21 is electrically coupled to the transistor TR provided under the memory cell array 10 via the contact CC coupled to the conductive layer 21 from below. Similarly, each of the conductive layers 22 and 23 included in the stacked interconnects is coupled to the transistor provided under the memory cell array 10, i.e., on the lower wafer LW, via the contacts CC, the conductive layer 27, etc. coupled from below the conductive layers 22 and 23.

FIG. 29 is a cross-sectional view showing an example of a detailed cross-sectional structure at a bonded portion of the semiconductor device 1 according to the fifth embodiment. As shown in FIG. 29, the conductive layers 93 and 94 have different tapered shapes depending on the etching direction during formation. Specifically, the conductive layer 93 (bonding pad BP_L) formed using the lower wafer LW has a reverse tapered shape. The conductive layer 94 (bonding pad BP_U) formed using the upper wafer UW has a tapered shape. The conductive layers 93 and 94 may be displaced and bonded together depending on alignment during the bonding process. That is, a level difference may be formed between an upper surface of the conductive layer 93 and a lower surface of the conductive layer 94.

The bonding pads BP that form a pair and face each other between the memory chip and the CMOS chip may have a boundary or may be integrated. The conductive layer 93 (bonding pad BP_L) may be coupled to the conductive layer 73 without the contact C3. The conductive layer 93 (bonding pad BP_L) may be coupled to the conductive layer 73 via a plurality of contacts C3. The conductive layer 94 (bonding pad BP_U) may be coupled to the conductive layer 28 without the contact V1. The conductive layer 94 (bonding pad BP_U) may be coupled to the conductive layer 28 via a plurality of contacts V1.

In this specification, the "tapered shape" refers to a shape that becomes thinner as it recedes from the substrate used as a reference. The "reverse tapered shape" refers to a shape that becomes thicker as it recedes from the substrate used as a reference. The bonding pad BP_U, which is formed in a reverse tapered shape in the front-end process of the upper wafer UW, may be considered tapered with respect to the semiconductor substrate 20 of the lower wafer LW, since the bonding pad BP_U is vertically inverted and bonded by the bonding process.

(Cross-Sectional Structure in Wall Region WR of Semiconductor Device 1)

FIG. 30 is a cross-sectional view showing an example of a cross-sectional structure in the wall region WR of the semiconductor device 1 according to the fifth embodiment. As shown in FIG. 30, the semiconductor device 1 according to the fifth embodiment has a configuration in which the sealing portions ES1f, ES2f, ES3f, and ES4f of the semiconductor device 1 according to the fourth embodiment are replaced with sealing portions ES1g, ES2g, ES3g, and ES4g, respectively. Specifically, the semiconductor device 1 of the fifth embodiment has in the wall region WR_L a structure similar to that under the insulating layer 36 of the semiconductor device 1 according to the fourth embodiment, and has in the wall region WR_U a structure similar to the structure above the insulating layer 36 of the semiconductor device 1 according to the fourth embodiment that is vertically inverted. A sealing member of each of the sealing portions ES1g, ES2g, ES3g, and ES4g further includes conductive layers 95 and 96 and a contact 97.

The structures of the contacts 80, 82, 84, 86, 60, 58, and 97 and the conductive layers 81, 83, 85, 95, 96, 59, and 57 in each of the sealing portions ES1g, ES2g, ES3g, and ES4g are similar. Specifically, in each of the sealing portions ES1g, ES2g, ES3g, and ES4g, the conductive layer 81 is provided on the semiconductor substrate 20 via the contact 80. The conductive layer 83 is provided on the conductive layer 81 via the contact 82. The conductive layer 85 is provided on the conductive layer 83 via the contact 84.

The conductive layer 95 is provided on the conductive layer 85 via the contact 86. The conductive layer 96 is provided on the conductive layer 95. The conductive layers 95 and 96 correspond to the bonding pads of the sealing portions ES_L and ES_U, respectively. A more detailed cross-sectional shape of the conductive layer 95 is, for example, similar to the cross-sectional shape of the conductive layer 93 (bonding pad BP_L) described using FIG. 29. A more detailed cross-sectional shape of the conductive layer 96 is, for example, similar to the cross-sectional shape of the conductive layer 94 (bonding pad BP_U) described using FIG. 29. The conductive layers 95 and 96 may be displaced and bonded together depending on the alignment during the bonding process. That is, an upper surface of the conductive layer 95 and a lower surface of the conductive layer 96 may form a level difference.

The conductive layer 59 is provided on the conductive layer 96 via the contact 60. The conductive layer 57 is provided on the conductive layer 59 via the contact 58. The contact 97 is provided on the conductive layer 57. A top of the contact 97 is, for example, in contact with the semiconductor layer 70. The conductive layers 81, 83, 85 and 95 corresponding to the sealing portion ES_L are included in the interconnect layers D0, D1, D2, and D3, respectively. The conductive layers 96, 59, and 57 corresponding to the sealing portion ES_U are included in the interconnect layers M2, M1, and M0, respectively.

A set of the contacts 80, 82, 84 and 86 and conductive layers 81, 83, 85, and 95 of each of the sealing portions ES1g, ES2g, ES3g, and ES4g divides the insulating layers 35 and 90. A set of the contacts 60, 58, and 97 and conductive layers 96, 59, and 57 of each of the sealing portions ES1g, ES2g, ES3g, and ES4g divides the insulating layers 91, 34, and 33. Each of the contacts 80, 82, 84, 86, 60, 58, and 97 and the conductive layers 81, 83, 85, 95, 96, 59, and 57 is, for example, a metal. In each of the sealing portions ES1g, ES2g, ES3g, and ES4g, the contacts 80, 82, 84, 86, 60, 58, and 97 and the conductive layers 81, 83, 85, 95, 96, 59, and 57 are electrically coupled. An insulating film may be provided on a side surface of each of the contacts 80, 82, 84, 86, 60, 58, and 97 as a spacer.

A sealing member of each of the sealing portions ES1g, ES2g, ES3g, and ES4g is provided in a square ring shape in the top view. Then, the sealing member of each of the sealing portions ES1g, ES2g, ES3g, and ES4g surrounds the core region CR in the top view. That is, in an area omitted from the figure, the sealing member of each of the sealing portions ES1g, ES2g, ES3g, and ES4g has a portion extending in the Y direction and a portion extending in the X direction. The sealing member of each of the sealing portions ES1g, ES2g, ES3g, and ES4g can be regarded as a wall between the core region CR and the kerf region KR.

In the semiconductor device 1 of the fifth embodiment, the sealing member of the sealing portion ES1g provided at the outermost periphery has voids in the same manner as in the fourth embodiment. In this example, each of the contacts 80, 82, 84, 86, 60, 58, and 97 of the sealing portion ES1g has a void. These voids preferably surround the core region CR in the top view.

Each of the conductive layers 81, 83, 85, 95, 96, 59, and 57 of the sealing portion ESig may have a void. In the fifth embodiment, it suffices that any one of the contacts 80, 82, 84, 86, 60, 58, and 97 and the conductive layers 81, 83, 85, 95, 96, 59, and 57 constituting the sealing member of the sealing portion ES1g has a void. In the fifth embodiment, the case in which a sealing member having a void is arranged in the sealing portion ESlg is exemplified, but a sealing member having a void may be arranged in the other sealing portions ES. The other structures of the semiconductor device 1 according to the fifth embodiment are the same as those in the fourth embodiment.

[5-3] Advantageous Effects of Fifth Embodiment

Similar to the fourth embodiment, the semiconductor device 1 according to the fifth embodiment can, when a path of a crack during dicing deviates toward the wall region WR side, guide the path (propagating direction) of the crack upwardly in the wall region WR by means of the void in the sealing member of the sealing portion ES1g. Therefore, the semiconductor device 1 according to the fifth embodiment can suppress the occurrence of chipping in the dicing process and reduce the number of defective chips. That is, the semiconductor device 1 according to the fifth embodiment can improve the yield of the semiconductor device 1 in the same manner as in the fourth embodiment.

The fifth embodiment corresponds to a combination of the semiconductor device 1 having a structure in which a memory chip and a CMOS chip are bonded and the sealing portion ES1g having a structure similar to the sealing portion ES1 of the first embodiment. The configuration is not limited thereto, and the semiconductor device 1 having a structure in which a memory chip and a CMOS chip are bonded may be combined with any one of the modification of the first embodiment, the second embodiment, the modification of the second embodiment, and the third embodiment. In the semiconductor device 1 according to the fifth embodiment, sealing members of a plurality of sealing portions ES may have voids, and the design of the sealing portions ES may be changed as appropriate based on the contents of the modification of the first embodiment, the second embodiment, the modification of the second embodiment, and the third embodiment.

[6] SIXTH EMBODIMENT

A sixth embodiment forms the structure of the semiconductor device 1 described in the fifth embodiment by a process that allows reuse of the upper wafer UW. Details of a manufacturing method of a semiconductor device 1 according to the sixth embodiment will be described in terms of differences from the first to fifth embodiments.

[6-1] Manufacturing Method of Semiconductor Device 1

FIG. 31 is a schematic diagram showing an example of the manufacturing method of the semiconductor device 1 according to the sixth embodiment. Hereinafter, the manufacturing method of the semiconductor device 1 according to the sixth embodiment will be described with reference to FIG. 31.

First, in the same manner as in the fifth embodiment, a lot including an upper wafer UW and a lot including a lower wafer LW are prepared ("Lot assignment"). Then, a front-end process is executed for each of the lot including the upper wafer UW and the lot including the lower wafer LW.

In the sixth embodiment, a porous silicon layer PL is formed on a front surface of the upper wafer UW before a device layer 100 is formed in the front-end process of the upper wafer UW ("porous layer formation"). In other words, the porous silicon layer PL is formed between the silicon substrate (upper wafer UW) and the device layer 100. The device layer 100 includes a memory cell array 10, etc. The porous silicon layer PL is a layer of polysilicon having numerous micropores. A mechanical strength of the porous silicon layer PL is lower than that of a polysilicon layer.

The porous silicon layer PL is formed by first forming a polysilicon layer on the silicon substrate and then anodizing the formed polysilicon layer. Since anodization is performed by bringing the wafer into contact with the electrode, there is an outermost peripheral region on the wafer where the porous silicon layer PL is not formed (hereinafter referred to as a "non-formed region NPL"). After the porous silicon layer PL is formed, the device layer 100 including the memory cell array 10 is formed on the porous silicon layer PL and the non-formed region NPL ("memory cell array formation").

A front-end process of the lower wafer LW in the sixth embodiment is the same as that in the fifth embodiment. By the front-end process of the lower wafer LW, a CMOS layer 200 including a row decoder module 15, etc. is formed on the lower wafer LW ("CMOS formation").

After the front-end processes of the upper wafer UW and the lower wafer LW are completed, a bonding process is executed in the same manner as in the fifth embodiment. Thereby, the front surfaces of the upper wafer UW and the lower wafer LW are bonded together. That is, the device layer 100 and the CMOS layer 200 are bonded together.

Then, in the sixth embodiment, a peeling process is executed after the bonding process. In the peeling process, cracking is first initiated from the bonded surface of the bonded upper wafer UW and lower wafer LW. Then, the upper wafer UW (silicon substrate) is peeled off starting from the porous silicon layer PL, which has a low mechanical strength. Thus, in the peeling process, it is preferable to ensure that a crack initiated at an outer peripheral portion of the bonded surface propagates toward the porous silicon layer PL.

The peeled upper wafer UW has the porous silicon layer PL divided by the crack and the non-formed region NPL. The peeled upper wafer UW is reused after these porous silicon layer PL and non-formed region NPL are removed. On the other hand, the lower wafer LW having the device layer 100 and the CMOS layer 200 is transferred to processing of a wiring process after the porous silicon layer PL divided by the crack and the non-formed region NPL are removed. The other configurations and manufacturing method of the semiconductor device 1 according to the sixth embodiment are the same as those in the fifth embodiment.

[6-2] Advantageous Effect of Sixth Embodiment

In the manufacturing step of the semiconductor device 1 having a chip-bonded structure, a process of reusing the upper wafer UW is considered. In the peeling process after the bonding process, it is preferable that a crack develops in the porous silicon layer PL. However, it is difficult to apply a direct force to the porous silicon layer PL in the peeling process. Thus, in the process of reusing the upper wafer UW, a crack generated in the peeling process may progress to the bonded surface and the core region CR, causing defects such as peeling of the device layer 100 and destruction of the device layer 100.

Accordingly, the semiconductor device 1 according to the sixth embodiment controls the propagating direction of the crack in the peeling process by having the sealing portion ES1g having a void similar to that of the fifth embodiment.

FIG. 32 is a schematic diagram showing an example of a path of a crack that occurs during the peeling process in the semiconductor device 1 according to the sixth embodiment, and shows a cross section including each of the core region CR and the wall region WR of the semiconductor device 1 according to the sixth embodiment provided in the vicinity of the wafer periphery. As shown in FIG. 32, the semiconductor device 1 according to the sixth embodiment has a structure in which the porous silicon layer PL and the non-formed region NPL are added on the semiconductor layer 70 with respect to the structure between the semiconductor substrate 20 and the semiconductor layer 70 in FIG. 28 during the peeling process. For example, a first path and a second path are assumed as the crack path in the peeling process.

The first path is a path where the crack propagates from a starting point of peeling ("peeling start") to the porous silicon layer PL through the non-formed region NPL at the wafer outer periphery. In such a case, the structures provided in the wall region WR and the core region CR of the semiconductor device 1 may remain undestroyed.

The second path is a path where the crack propagates from the starting point of peeling ("peeling start") to the porous silicon layer PL through the sealing portion ES1g of the semiconductor device 1 provided in the vicinity of the wafer outer periphery. In such a case, when a tip end of the crack reaches the sealing portion ES1g, the crack tip end is guided upward to the semiconductor substrate 20 along the void in the sealing portion ES1g and then to the porous silicon layer PL. This may allow the structures provided in the wall region WR and the core region CR of the semiconductor device 1 to remain undestroyed also in the second path.

As described above, the semiconductor device 1 according to the sixth embodiment can, when a path of a crack during the peeling process is deflected to the wall region WR side, guide the path (propagating direction) of the crack to the porous silicon layer PL above the upper part of the wall region WR by means of the void in the sealing member of the sealing portion ES1g. Therefore, the semiconductor device 1 according to the sixth embodiment can suppress the occurrence of peeling of the device layer 100 and destruction of the device layer 100 in the peeling process and reduce the number of defective chips. That is, the semiconductor device 1 according to the sixth embodiment can improve the yield of the semiconductor device 1.

The peeling process described in the sixth embodiment starts, for example, from the chipped chip (invalid chip) located at the outer peripheral portion of the wafer. Even when the peeling starts from the chipped chip, the upper wafer UW can be peeled as the crack progresses along the sealing portion ES of the valid chip adjacent to the chipped chip and is guided to the porous silicon layer PL. Further, the peeling process can efficiently peel off the upper wafer UW by starting the peeling from a portion where the wafer end and the chip end overlap.

In addition, the sixth embodiment may be combined with any one of the modification of the first embodiment, the second embodiment, the modification of the second embodiment, and the third embodiment. That is, in the semiconductor device 1 according to the sixth embodiment, sealing members of a plurality of sealing portions ES may have voids, and the design of the sealing portions ES may be changed as appropriate based on the contents of the modification of the first embodiment, the second embodiment, the modification of the second embodiment, and the third embodiment. If only the propagating direction of the crack during the peeling process is controlled without considering the dicing process, the voids in the sealing portion ES_L of the CMOS layer 200 may be omitted.

[7] OTHERS

In the above embodiments, the number of sealing portions ES provided in the semiconductor device 1 is not limited to the number described in the embodiments. Two or more sealing portions may be provided. A sealing member coupled to an N-type impurity diffusion region may be adjacent to a sealing member coupled to an N-type impurity diffusion region. A sealing member coupled to a P-type impurity diffusion region may be adjacent to a sealing member coupled to a P-type impurity diffusion region. Two or more sealing members that are coupled to the same type of impurity diffusion region and are adjacent to each other may share a conductive layer, etc. Except in the case where the modification of the first embodiment is applied, it suffices that the sealing portion ES has at least a sealing member having a square ring wall-shaped structure, and the numbers of contacts and conductive layers included in each of the sealing portions ES may be other numbers. As a material used as the conductive layer and the contact included in the sealing portion ES, for example, a metallic material such as titanium, titanium nitride, or tungsten is used.

In the above embodiments, the semiconductor layer 41 of the memory pillar MP may be coupled to the source line SL via the side surface of the memory pillar MP. The memory pillar MP may have a structure in which two or more pillars are connected in the Z direction. The memory pillar MP may have a structure in which a pillar corresponding to a select gate line SGD and a pillar corresponding to a word line WL are connected. The memory pillar MP and the bit line BL, the contact CC and the conductive layer 27, and the contact C3 and the conductive layer 29, may each be coupled by a plurality of contacts that are connected together in the Z direction. A conductive layer may be inserted into connecting portions of the plurality of contacts. This also applies to other contacts. The number of interconnect layers and contacts included in the semiconductor device 1 can be changed as appropriate according to the circuit design of the semiconductor device 1.

In the above embodiments, each of the circuit configuration, planar layout, and cross-sectional structure of the semiconductor device 1 can be changed as appropriate according to the design of the semiconductor device 1. For example, in the fifth embodiment, the case where the memory chip is provided on the CMOS chip is exemplified, but the CMOS chip may be provided on the memory chip. That is, the memory chip may be allocated to the lower wafer LW and the CMOS chip to the upper wafer UW.

In the drawings used for the descriptions of the above embodiments, the case in which the memory pillars MP have the same diameter in the Z direction is exemplified, but the invention is not limited thereto. The memory pillar MP may have a tapered shape, a reverse tapered shape, or a bowing shape. Similarly, each of the slits SLT and SHE may have a tapered shape, a reverse tapered shape, or a bowing shape. Also, each contact may have a tapered shape, a reverse tapered shape, or a bowing shape. A cross-sectional structure of each of the memory pillar MP and the contacts CC and C3 may be circular, elliptical or oval. In this specification, a position of a slit SLT may be specified based on, for example, a position of a contact LI.

In the above embodiments, the case in which memory circuits such as the memory cell array 10 are formed in the core region CR is described as an example, but the present invention is not limited thereto. The structures of the above embodiments can be applied not only to memory circuits such as a NAND flash memory, but also to other semiconductor integrated circuits. That is, at least one sealing portion ES (sealing member) having a void described in the above embodiments may be provided in the wall region WR, and the other semiconductor integrated circuits may be provided in the core region CR. Also in such a case, the occurrence of chipping in the dicing process may be suppressed and the yield of the semiconductor device can be improved.

As regards the "square ring shape" in this specification, it suffices that a target structural element is formed in a ring shape while including at least portions extending in directions intersecting each other. Further, the "square ring shape" may be formed to have a corner portion obliquely formed, and may include a portion in which a side is not formed in a straight line. The "square ring shape" is preferably a perfect ring, but a part of the ring portion may be interrupted. If the sealing portion ES has a substantially ring-shaped structure, the advantageous effect of the sealing portion ES described in the above embodiments can be realized. The "ring shape" is not limited to a circle, but also includes a square ring shape.

The term "couple" in this specification refers to electrical coupling, and does not exclude, for example, another element in between. "Electrical coupling" may be via an insulator as long as such coupling is capable of operating in a manner similar to electrical coupling without intervention of an insulator. The term "columnar" indicates being a structure which is provided in a hole formed in the manufacturing step of the semiconductor device 1. The "diameter" indicates the inner diameter of a hole, etc. in a cross section parallel to the surface of the semiconductor substrate. The "width" indicates, for example, the width of a constituent element in the X direction or the Y direction. The "N-type impurity diffusion region" indicates a region in which the semiconductor substrate 20 is doped with N-type impurities. The "P-type impurity diffusion region" indicates a region in which the semiconductor substrate 20 is doped with P-type impurities. The "semiconductor layer" may be referred to as a "conductive layer".

In this specification, the "area" may be regarded as a configuration included by the semiconductor substrate 20. For example, when the semiconductor substrate 20 is defined as including the memory area MA and the hookup area HA, the memory area MA and the hookup area HA are respectively associated with different areas above the semiconductor substrate 20. The "height" corresponds to, for example, a distance in the Z direction between a measurement target configuration and the semiconductor substrate 20. As a reference of the "height", a configuration other than the semiconductor substrate 20 may be used. The "planar position" indicates a position of a structural element in a planar layout. The "top (plan) view" corresponds, for example, to looking at the semiconductor substrate 20 from the upper side of the substrate.

While certain embodiments of the present invention have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first chip including a substrate, the substrate including a first region, and a second region provided to surround an outer periphery of the first region; and
a second chip bonded to the first chip, the second chip including a plurality of word lines provided to be separated from one another in a first direction intersecting a surface of the substrate in the first region, and an insulating layer provided in the second region and divided by a first sealing portion in the second region, wherein
the first sealing portion is provided to extend at least from above the substrate to a height of an upper end of the insulating layer and surround the outer periphery of the first region in the second region,
the first sealing portion includes a first conductive member including a first void,
the first conductive member is provided to extend in the first direction at a height where the plurality of word lines are provided, and have a perfect ring shape surrounding the outer periphery of the first region in a plan view, and
the first sealing portion further includes a first pad portion on a bonded surface between the first chip and the second chip, the first pad portion having a perfect ring shape surrounding the outer periphery of the first region in a plan view.

2. The semiconductor device of claim 1, wherein
the first conductive member includes a first conductor provided to surround the outer periphery of the first region, the first conductor including the first void,
the first conductor has a first width at a first height, has a second width wider than the first width at a second height higher than the first height, and has a third width narrower than the second width at a third height higher than the second height, along a second direction parallel to the surface of the substrate, and
a part of the first void is included at the second height of the first conductor.

3. The semiconductor device of claim 1, wherein
the first sealing portion further includes a second conductive member provided on the substrate.

4. The semiconductor device of claim 3, wherein
the substrate includes a P-type or N-type impurity diffusion region at a portion in contact with the second conductive member.

5. The semiconductor device of claim 1, wherein
the insulating layer is further divided by a second sealing portion in the second region on a side further inward than the first sealing portion, the second sealing portion being provided to extend at least from above the substrate to the height of the upper end of the insulating layer and surround the outer periphery of the first region in the second region,
the second sealing portion includes a third conductive member provided to extend in the first direction at the height where the plurality of word lines are provided,
the first conductive member includes a first conductor provided to surround the outer periphery of the first region, the first conductor including the first void,
the third conductive member includes a second conductor provided to surround the outer periphery of the first region at a height approximately same as a height of the first conductor,
a width of the first conductor in a second direction parallel to the surface of the substrate is narrower than a width of the second conductor in the second direction, and
the third conductive member further includes a third conductor provided on the second conductor, a height of a lower end of the third conductor being approximately aligned with a height of a lower end of each of the first conductor and the second conductor.

6. The semiconductor device of claim 1, wherein
the first sealing portion includes a first layer and a second layer arranged in the first direction,
the first layer is composed of an insulator, and
the second layer is composed of a void.

7. The semiconductor device of claim 1, wherein
the first sealing portion includes a first layer, a second layer, and a third layer arranged in the first direction,
any one of the first layer, the second layer, and the third layer is composed of an insulator,
any one of the first layer, the second layer, and the third layer is composed of a void, and
any one of the first layer, the second layer, and the third layer includes a conductor.

8. The semiconductor device of claim 1, wherein
the second chip further includes a pillar provided to extend in the first direction and penetrate the word lines in the first region, intersections between the pillar and the word lines each functioning as a memory cell, and
a height of a lower end of the first void is lower than a height of a lower end of the pillar.

9. The semiconductor device of claim 1, wherein
the insulating layer is further divided by a third sealing in the second region on a side further inward than the first sealing portion, the third sealing portion being provided to extend at least from above the substrate to the height of the upper end of the insulating layer and surround the outer periphery of the first region, in the second region, and the third sealing portion includes a second void.

10. The semiconductor device of claim 9, wherein
a height of an upper end of the second void is higher than a height of an upper end of the first void, and/or a height of a lower end of the second void is higher than a height of a lower end of the first void.

11. The semiconductor device of claim 9, wherein
the third sealing portion includes a fourth conductive member including the second void,
the fourth conductive member is provided to extend in the first direction at the height where the plurality of word lines are provided, and have a perfect ring shape surrounding the outer periphery of the first region in a plan view, and
the third sealing portion includes a second pad portion on the bonded surface, the second pad portion having a perfect ring shape surrounding the outer periphery of the first region in a plan view.

12. The semiconductor device of claim 11, wherein
the first sealing portion further includes a fifth conductive member provided on the substrate, and
the third sealing portion further includes a sixth conductive member provided on the substrate.

13. The semiconductor device of claim 11, wherein
the first conductive member includes a first conductor provided to surround the outer periphery of the first region, the first conductor including the first void,
the fourth conductive member includes a fourth conductor provided to surround the outer periphery of the first region at a height approximately same as a height of the first conductor, the fourth conductor including the second void, and
a height of an upper end of the second void is higher than a height of an upper end of the first void, and/or a height of a lower end of the second void is higher than a height of a lower end of the first void.

14. The semiconductor device of claim 13, wherein
a width of a lower end of the first conductor in a second direction parallel to the surface of the substrate is wider than a width of a lower end of the fourth conductor in the second direction.

15. The semiconductor device of claim 11, wherein
the second chip further includes a pillar provided to extend in the first direction and penetrate the word lines in the first region, intersections between the pillar and the word lines each functioning as a memory cell, and
the height of the lower end of the second void is lower than a height of a lower end of the pillar.

16. The semiconductor device of claim 1, wherein
the first chip further includes a transistor provided on the substrate in the first region,
the second chip further includes a source line provided above the word lines, a pillar provided to extend in the first direction and penetrate the word lines in the first region, and a contact coupled to a first word line among the word lines from below,
an upper end of the pillar being is in contact with the source line,
intersections between the pillar and the word lines each function as a memory cell, and
the transistor is electrically coupled to the first word line via the second contact.

17. The semiconductor device of claim 16, wherein
the first chip further includes a first conductive layer,
the second chip further includes a second conductive layer coupled in series between the transistor and the contact,
the second conductive layer is provided on the first conductive layer,
the second conductive layer has a tapered shape, and
the first conductive layer has a reverse tapered shape.

* * * * *